(12) United States Patent
Yeh et al.

(10) Patent No.: US 7,439,085 B2
(45) Date of Patent: Oct. 21, 2008

(54) METHOD AND APPARATUS FOR ELECTROLUMINESCENCE

(75) Inventors: Chih Chieh Yeh, Taipei (TW); Shaw Hung Ku, Taipei (KR); Tahui Wang, Hsinchu (TW); Chih Yuan Lu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/749,006

(22) Filed: May 15, 2007

(65) Prior Publication Data

US 2007/0218575 A1 Sep. 20, 2007

Related U.S. Application Data

(62) Division of application No. 11/086,898, filed on Mar. 22, 2005, now Pat. No. 7,230,277.

(60) Provisional application No. 60/629,820, filed on Nov. 19, 2004.

(51) Int. Cl.
*H01L 21/00* (2006.01)

(52) U.S. Cl. .......................................... 438/23; 438/22
(58) Field of Classification Search .................. 438/22, 438/23
See application file for complete search history.

(56) References Cited

U.S. PATENT DOCUMENTS

| | | | | |
|---|---|---|---|---|
| 4,686,110 | A * | 8/1987 | Endo et al. ................... | 427/576 |
| 6,479,839 | B2 * | 11/2002 | Nikolaev et al. .............. | 257/82 |
| 6,697,403 | B2 * | 2/2004 | Lee et al. .................. | 372/43.01 |

OTHER PUBLICATIONS

A.T. Fiory et al. "Light Emission from Silicon: Some Perspectives and Applications" Journal of Electronic Materials, vol. 32, No. 10, 2003, pp. 1043-1051.

* cited by examiner

*Primary Examiner*—Long Pham
(74) *Attorney, Agent, or Firm*—Kenta Suzue; Haynes Beffel & Wolfeld LLP

(57) ABSTRACT

Methods and apparatuses for causing electroluminescence with charge trapping structures are disclosed. Various embodiments relate to methods and apparatuses for causing electroluminescence with charge carriers of one type provided to the charge trapping structure by a forward biased p-n structure or a reverse biased p-n structure.

26 Claims, 20 Drawing Sheets

US 7,439,085 B2

METHOD AND APPARATUS FOR ELECTROLUMINESCENCE

REFERENCE TO RELATED APPLICATION

This application is a divisional application of U.S. application Ser. No. 11/086,898, filed 22 Mar. 2005, which claims the benefit of U.S. Provisional Application No. 60/629,820, filed 19 Nov. 2004.

BACKGROUND OF THE INVENTION

1. Field of the Invention

The present invention relates to methods and apparatuses for causing electroluminescence with charge trapping structures. Embodiments of the present invention relate to methods and apparatuses for causing electroluminescence with charge carriers of one type provided to the charge trapping structure from a forward biased p-n structure or from a reverse biased p-n structure.

2. Description of Related Art

Electroluminescent devices emit photons by exciting material with electric field or current. Conventional silicon-based electroluminescent devices have low efficiency due to the indirect bandgap of silicon. Because of the indirect bandgap, prior to recombination between an electron and a hole, the momentum mismatch must be corrected, leading to the low efficiency. The low efficiency in turn results in low light density. One approach that addresses this momentum mismatch is by diverging the k-space through physical confinement in very small silicon quantum dots. However, the processing for making silicon dots sufficiently small is difficult and expensive.

Direct bandgap-based electroluminescent devices materials do not have the momentum mismatch issues associated with conventional silicon-based devices. However, many direct bandgap materials such as GaAs are more difficult to integrate with silicon, which has significant cost advantages and remains the material of choice for many more applications.

Conventional trapping material-based electroluminescent devices are relatively easy to integrate with silicon-based technologies such as CMOS. However, there are limitations to the electron and hole energies permitted by conventional trapping material-based electroluminescent devices. Because the transport mechanism for both electrons and holes into the charge trapping material is diffusion from a neighboring material such as a gate or the substrate, the energies of recombining holes and electrons are low due to collisions and phonon scattering, and the recombination events between these holes and electrons result in low energy photons. Also, the electron/hole recombination rate in the trapping material is small, because of the poor diffusion rates of electrons and holes in the trapping material.

SUMMARY OF THE INVENTION

Embodiments of the invention include electroluminescent devices and methods for causing electroluminescence.

One embodiment of an electroluminescent device includes a gate providing a gate voltage, a charge trapping structure controlled by the gate voltage in which electrons and holes combine to generate photons, and a body region such as a substrate or well region. The body region includes a contact region, such as a bit line formed in the body region. The body region and the contact region are doped oppositely. For example, the body region is doped p-type and the contact region is doped n-type, or the body region is doped n-type and the contact region is doped p-type. A region having p-type doping has holes as majority carriers and electrons as minority carriers, and a region having n-type doping has electrons as majority carriers and holes as minority carriers. Exemplary doping concentrations are between $10^{15}$ cm$^{-3}$ and $10^{19}$ cm$^{-3}$ for the body region, and between $10^{19}$ cm$^{-3}$ and $10^{21}$ cm$^{-3}$ for the contact region. If the contact region is doped p-type, the contact region is reverse biased with respect to the body region to provide electrons through at least the body region to the charge trapping structure. If the contact region is doped n-type, the contact region is reverse biased with respect to the body region to provide holes through at least the body region to the charge trapping structure.

One method embodiment for causing electroluminescence reverse biases the contact region with respect to the body region to 1) provide electrons from the contact region, through at least the body region, to the charge trapping structure and 2) combine the electrons provided from the contact region and holes in the charge trapping structure, thereby generating photons from the charge trapping structure. Another method embodiment for causing electroluminescence reverse biases the contact region with respect to the body region to 1) provide holes from the contact region, through at least the body region, to the charge trapping structure and 2) combine the holes provided from the contact region and holes in the charge trapping structure, thereby generating photons from the charge trapping structure.

In some embodiments, fewer photons are generated from the charge trapping structure by decreasing a magnitude of the reverse biasing, and more photons are generated by increasing the magnitude of reverse biasing. In some embodiments, fewer photons are generated from the charge trapping structure by decreasing a magnitude of an electric field moving charge carriers from the body region to the charge trapping structure, and more photons are generated by increasing the magnitude of the electric field moving charge carriers from the body region to the charge trapping structure.

In various embodiments, when charge of one type is provided by the contact region, charge of the opposite is provided from the gate or from the charge trapping structure. When charge of the opposite type is provided from the gate, a higher energy photon can be emitted since the carriers from the gate are accelerated by an electric field and have high carrier energy. When charge of the opposite type is provided from the gate, recombination efficiency is higher due to the higher carrier energy.

One embodiment of an electroluminescent device includes a gate providing a gate voltage, a charge trapping structure controlled by the gate voltage in which electrons and holes combine to generate photons, and a substrate region which can be a well region. The substrate region includes a well region formed in the substrate region. The substrate region and the well region are doped oppositely. For example, the substrate region is doped p-type and the well region is doped n-type, or the substrate region is doped n-type and the well region is doped p-type. The substrate region itself can be a well in which a well region is formed of the opposite doping type, in which case substrate region refers to a larger well region, and well region refers to a smaller well region. A region having p-type doping has holes as majority carriers and electrons as minority carriers, and a region having n-type doping has electrons as majority carriers and holes as minority carriers. Exemplary doping concentrations are between $10^{10}$ cm$^{-3}$ and $10^{13}$ cm$^{-3}$ for the substrate region, and between $10^{15}$ cm$^{-3}$ and $10^{19}$ cm$^{-3}$ for the well region. If the substrate region is doped p-type, the substrate region is forward biased with respect to the well region to provide holes through at least the well region to the charge trapping structure. If the substrate region is doped n-type, the substrate region is forward biased with respect to the well region to provide electrons through at least the substrate region to the charge trapping structure.

One method embodiment for causing electroluminescence forward biases the substrate region with respect to the well region to 1) provide electrons from the substrate region, through at least the well region, to the charge trapping structure and 2) combine the electrons provided from the substrate region and holes in the charge trapping structure, thereby generating photons from the charge trapping structure. Another embodiment for causing electroluminescence forward biases the substrate region with respect to the well region to 1) provide holes from the substrate region, through at least the well region, to the charge trapping structure and 2) combine the holes provided from the substrate region and electrons in the charge trapping structure, thereby generating photons from the charge trapping structure.

In some embodiments, fewer photons are generated from the charge trapping structure by decreasing a magnitude of the forward biasing, and more photons are generated by increasing the magnitude of forward biasing. In some embodiments, fewer photons are generated from the charge trapping structure by decreasing a magnitude of an electric field moving charge carriers from the substrate region to the charge trapping structure, and more photons are generated by increasing the magnitude of the electric field moving charge carriers from the substrate region to the charge trapping structure.

In various embodiments, when charge of one type is provided by the contact region, charge of the opposite is provided from the gate or from the charge trapping structure. When charge of the opposite type is provided from the gate, a higher energy photon can be emitted since the carriers from the gate are accelerated by an electric field and have high carrier energy, When charge of the opposite type is provided from the gate, recombination efficiency is higher due to the higher carrier energy.

In various embodiments, the charge trapping structure includes just one charge trapping region, or multiple charge trapping regions separated from each other by dielectric regions. Having just one charge trapping region as the charge trapping structure simplifies the manufacturing process. Having multiple charge trapping regions in the charge trapping structure increases the photon emission efficiency.

In various embodiments, one or more isolation dielectrics are somewhere between the gate and the charge trapping structure, no isolation dielectrics are somewhere between the gate and the charge trapping structure, one or more isolation dielectrics are somewhere between the body region or well region and the charge trapping structure, and no isolation dielectrics are somewhere between the body region or well region and the charge trapping structure. Fewer isolation dielectrics simplify the manufacturing process. More isolation dielectrics increase the confinement of carriers in the charge trapping structure, increasing recombination efficiency.

DETAILED DESCRIPTION

Figure 1:
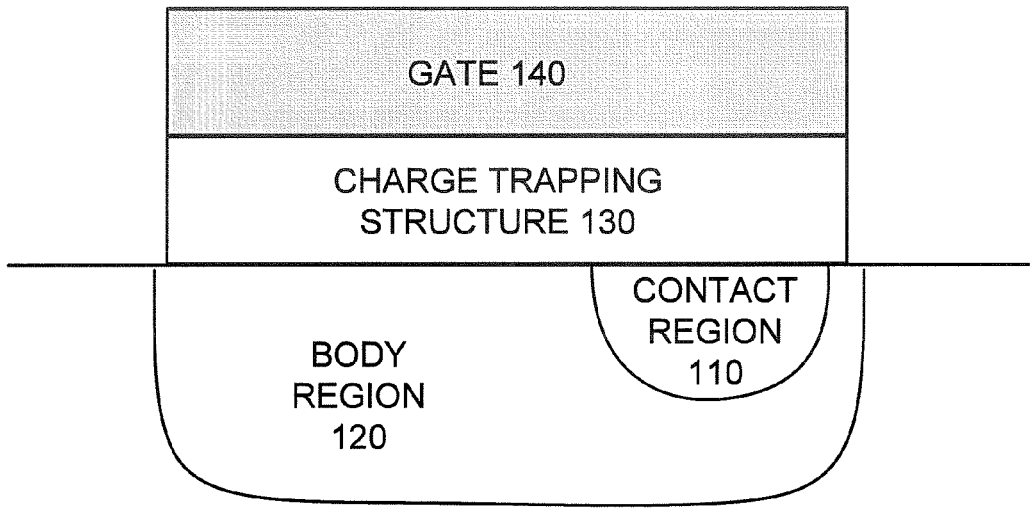
FIG. 1 shows an electroluminescent charge trapping device that receives charge from a contact region in a body region.

FIG. 1 shows an electroluminescent charge trapping device that receives charge from a contact region in a body region. A gate 140 is above a charge trapping structure 130. The charge trapping structure 130 is above a body region 120. The body region 120 includes a contact region 110 by the charge trapping structure 130. Possible charge trapping structure materials include silicon nitride, oxynitride, or other similar high dielectric constant materials, including metal oxides such as $Al_2O_3$, $HfO_2$. Exemplary doping concentrations are between $10^{15}$ $cm^{-3}$ and $10^{19}$ $cm^{-3}$ for the body region, and between $10^{19}$ $cm^{-3}$ and $10^{21}$ $cm^{-3}$ for the contact region.

Figure 2:
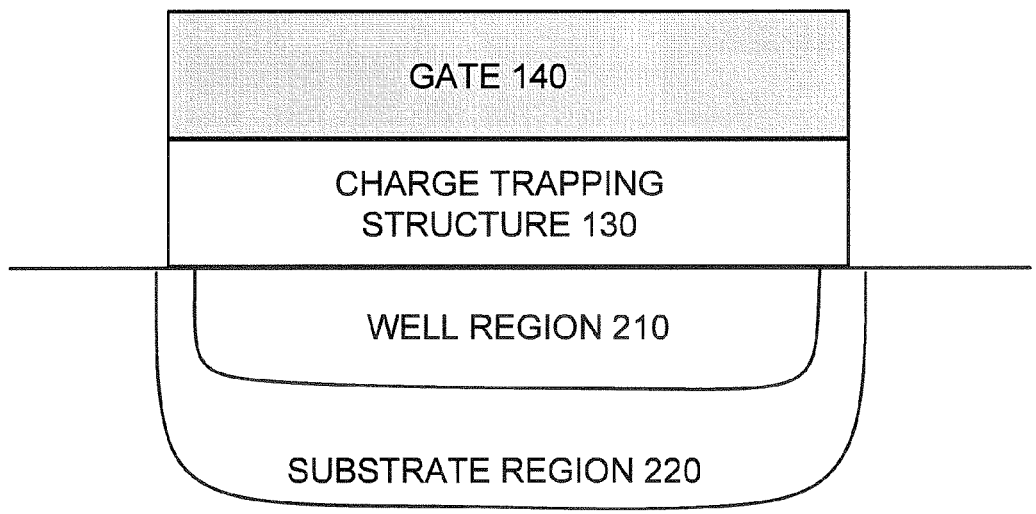
FIG. 2 shows an electroluminescent charge trapping device that receives charge from a substrate region through a well region.

FIG. 2 shows an electroluminescent charge trapping device that receives charge from a substrate region through a well region. A gate 140 is above a charge trapping structure 130. The charge trapping structure 130 is above a well region 210. The well region 210 is in a substrate region 220. Exemplary doping concentrations are between $10^{10}$ cm$^{-3}$ and $10^{13}$ cm$^{-3}$ for the substrate region, and between $10^{15}$ cm$^{-3}$ and $10^{19}$ cm$^{-3}$ for the well region.

By providing at least one of the charge carrier types, holes or electrons, with energy to the charge trapping structure, higher energy photons are emitted. High energy charge carriers are supplied via drifting in an electric field, such as those created as hot carriers or band-to-band hot carriers.

Figure 3:
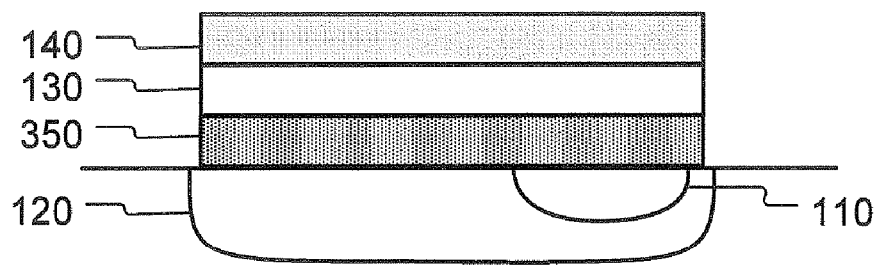
FIG. 3 shows an electroluminescent charge trapping device that receives charge from a contact region in a body region, with isolation dielectric between the charge trapping structure and the body region.

FIG. 3 shows an electroluminescent charge trapping device that receives charge from a contact region in a body region, with isolation dielectric between the charge trapping structure and the body region. A gate 140 is above a charge trapping structure 130. The charge trapping structure 130 is above a body region 120. The body region 120 includes a contact region 110. In addition, an isolation dielectric 350 is between the charge trapping structure 130 and the body region 120.

Figure 4:
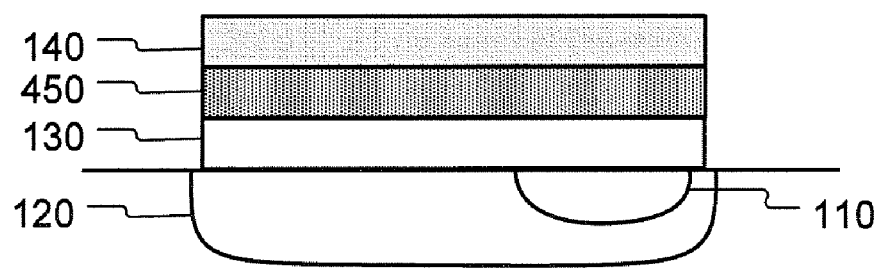
FIG. 4 shows an electroluminescent charge trapping device that receives charge from a contact region in a body region, with isolation dielectric between the charge trapping structure and the gate.

FIG. 4 shows an electroluminescent charge trapping device that receives charge from a contact region in a body region, with isolation dielectric between the charge trapping structure and the gate. The charge trapping structure 130 is above a body region 120. The body region 120 includes a contact region 110 by the charge trapping structure 130. In addition, an isolation dielectric 450 is between the charge trapping structure 130 and a gate 140.

Figure 5:
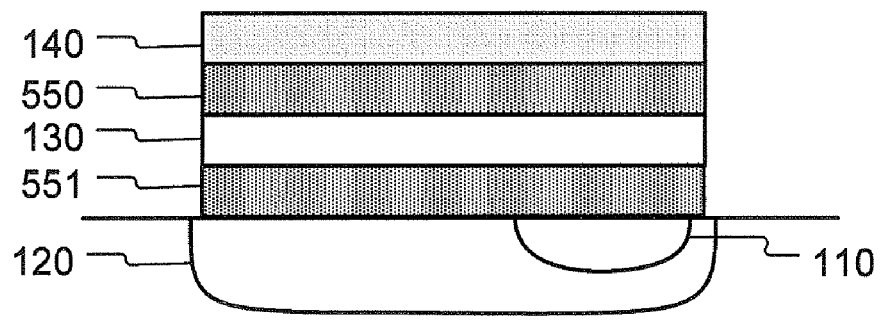
FIG. 5 shows an electroluminescent charge trapping device that receives charge from a contact region in a body region, with isolation dielectric between the charge trapping structure and the body region, and isolation dielectric between the charge trapping structure and the gate.

FIG. 5 shows an electroluminescent charge trapping device that receives charge from a contact region in a body region, with isolation dielectric between the charge trapping structure and the body region, and isolation dielectric between the charge trapping structure and the gate. The body region 120 includes a contact region 110. In addition, an isolation dielectric 551 is between the charge trapping structure 130 and the body region 120. Also, an isolation dielectric 550 is between the charge trapping structure 130 and a gate 140.

Figure 6:
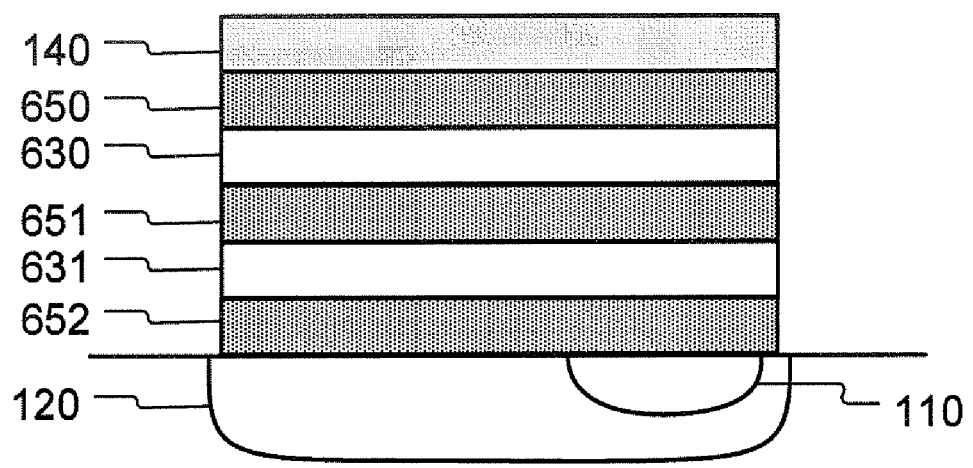
FIG. 6 shows an electroluminescent charge trapping device that receives charge from a contact region in a body region, with two charge trapping regions separated by isolation dielectric, isolation dielectric between any part of the charge trapping structure and the body region, and isolation dielectric between any part of the charge trapping structure and the gate.

FIG. 6 shows an electroluminescent charge trapping device that receives charge from a contact region in a body region, with two charge trapping regions separated by isolation dielectric, isolation dielectric between any part of the charge trapping structure and the body region, and isolation dielectric between any part of the charge trapping structure and the gate. Between a gate 140 and body region 120 including a contact region 110 are the following regions, in order: an isolation dielectric 650, a charge trapping region 630, an isolation dielectric 651, a charge trapping region 631, and an isolation dielectric 652.

Figure 7:
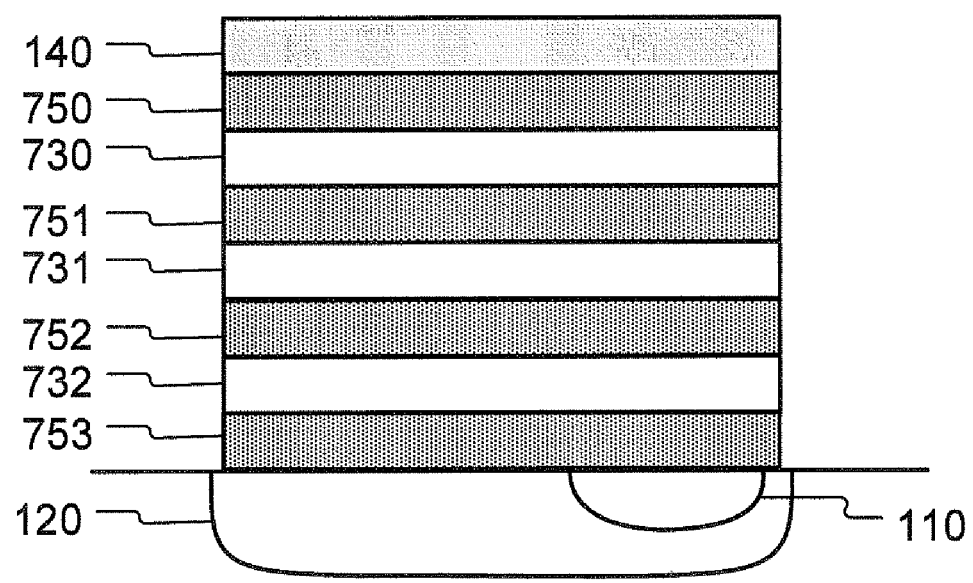
FIG. 7 shows an electroluminescent charge trapping device that receives charge from a contact region in a body region, with three charge trapping regions each separated by isolation dielectric, isolation dielectric between any part of the charge trapping structure and the body region, and isolation dielectric between any part of the charge trapping structure and the gate.

FIG. 7 shows an electroluminescent charge trapping device that receives charge from a contact region in a body region, with three charge trapping regions each separated by isolation dielectric, isolation dielectric between any part of the charge trapping structure and the body region, and isolation dielectric between any part of the charge trapping structure and the gate. Between a gate 140 and body region 120 including a contact region 110 are the following regions, in order: an isolation dielectric 750, a charge trapping region 730, an isolation dielectric 751, a charge trapping region 731, an isolation dielectric 752, a charge trapping region 732, and an isolation dielectric 753.

Figure 8:
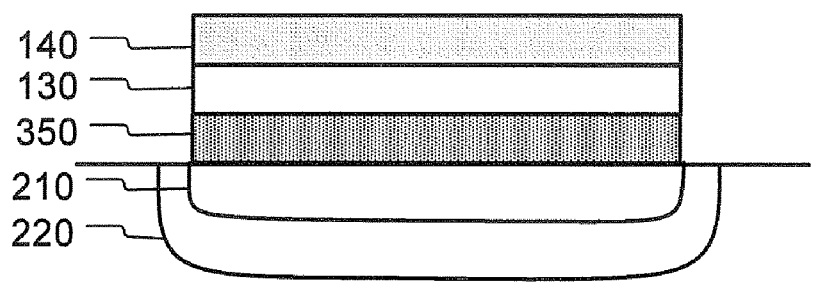
FIG. 8 shows an electroluminescent charge trapping device that receives charge from a substrate region through a well region, with isolation dielectric between the charge trapping structure and the well region.

FIG. 8 shows an electroluminescent charge trapping device that receives charge from a substrate region through a well region, with isolation dielectric between the charge trapping structure and the well region. A gate 140 is above a charge trapping structure 130. The charge trapping structure 130 is above a well region 210. The well region 210 is in a substrate region 220. In addition, an isolation dielectric 350 is between the charge trapping structure 130 and the well region 210.

Figure 9:
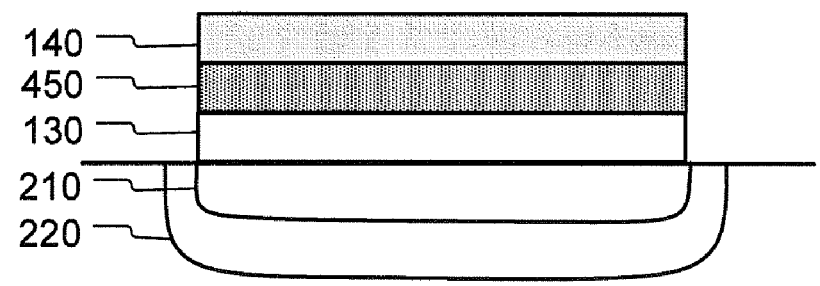
FIG. 9 shows an electroluminescent charge trapping device that receives charge from a substrate region through a well region, with isolation dielectric between the charge trapping structure and the gate.

FIG. 9 shows an electroluminescent charge trapping device that receives charge from a substrate region through a well region, with isolation dielectric between the charge trapping structure and the gate. The charge trapping structure 130 is above a well region 210. The well region 210 is in a substrate region 220. In addition, an isolation dielectric 450 is between the charge trapping structure 130 and a gate 140.

Figure 10:
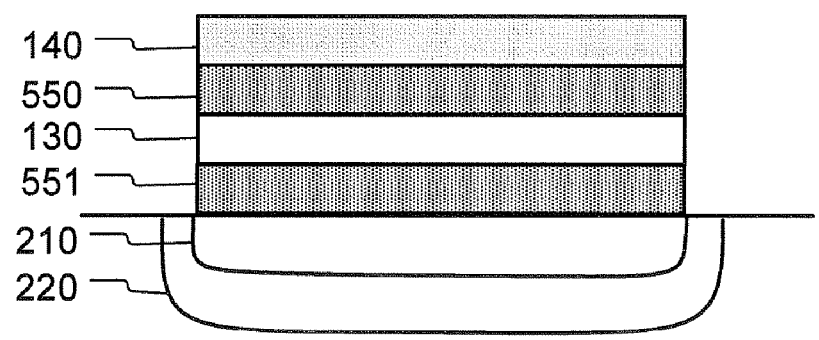
FIG. 10 shows an electroluminescent charge trapping device that receives charge from a substrate region through a well region, with isolation dielectric between the charge trapping structure and the well region, and isolation dielectric between the charge trapping structure and the gate.

FIG. 10 shows an electroluminescent charge trapping device that receives charge from a substrate region through a well region, with isolation dielectric between the charge trapping structure and the well region, and isolation dielectric between the charge trapping structure and the gate. The well region 210 is in a substrate region 220. In addition, an isolation dielectric 551 is between the charge trapping structure 130 and the well region 210. Also, an isolation dielectric 550 is between the charge trapping structure 130 and a gate 140.

Figure 11:
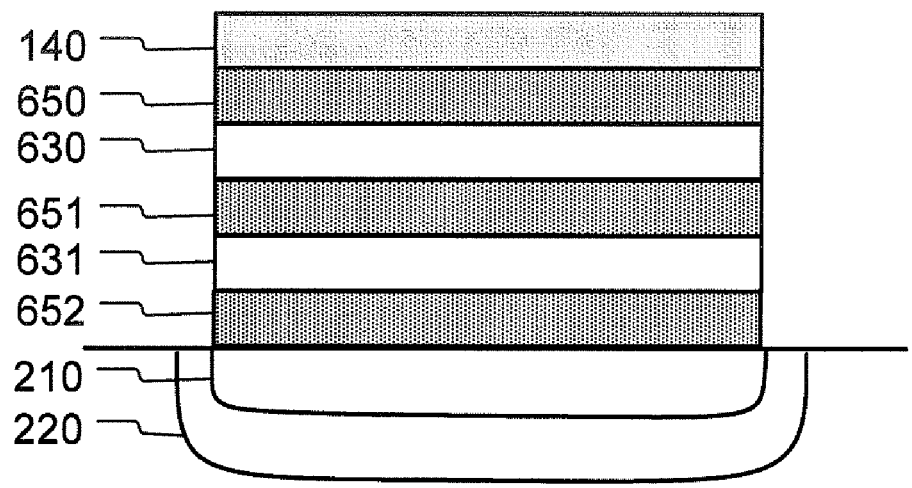
FIG. 11 shows an electroluminescent charge trapping device that receives charge from a substrate region through a well region, with two charge trapping regions separated by isolation dielectric, isolation dielectric between any part of the charge trapping structure and the well region, and isolation dielectric between any part of the charge trapping structure and the gate.

FIG. 11 shows an electroluminescent charge trapping device that receives charge from a substrate region through a well region, with two charge trapping regions separated by isolation dielectric, isolation dielectric between any part of the charge trapping structure and the well region, and isolation dielectric between any part of the charge trapping structure and the gate. Between a gate 140 and well region 210, which is in a substrate region 220, are the following regions, in order: an isolation dielectric 650, a charge trapping region 630, an isolation dielectric 651, a charge trapping region 631, and an isolation dielectric 652.

Figure 12:
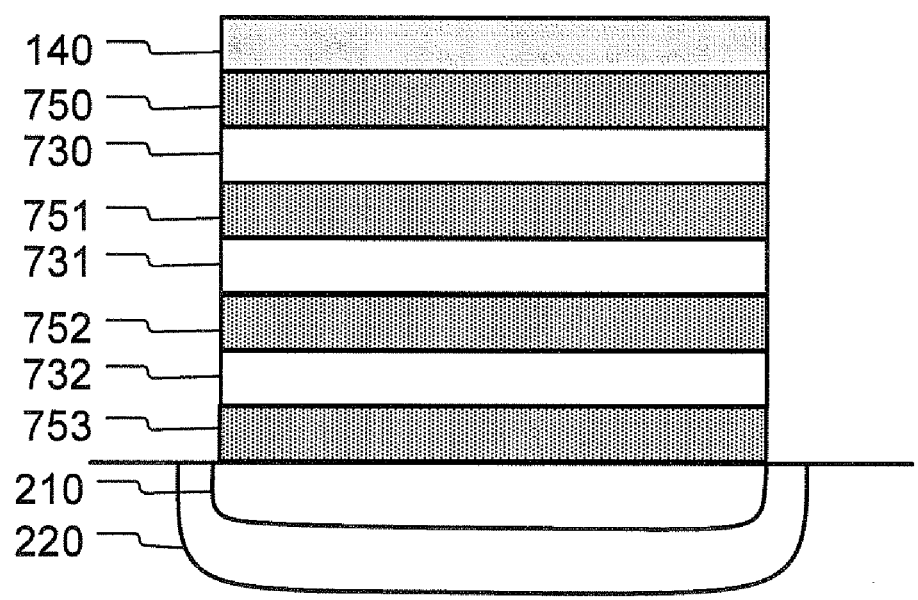
FIG. 12 shows an electroluminescent charge trapping device that receives charge from a substrate region through a well region, with three charge trapping regions each separated by isolation dielectric, isolation dielectric between any part of the charge trapping structure and the well region, and isolation dielectric between any part of the charge trapping structure and the gate.

FIG. 12 shows an electroluminescent charge trapping device that receives charge from a substrate region through a well region, with three charge trapping regions each separated by isolation dielectric, isolation dielectric between any part of the charge trapping structure and the well region, and isolation dielectric between any part of the charge trapping structure and the gate. Between a gate 140 and well region 210, which is in a substrate region 220, are the following regions, in order: an isolation dielectric 750, a charge trapping region 730, an isolation dielectric 751, a charge trapping region 731, an isolation dielectric 752, a charge trapping region 732, and an isolation dielectric 753.

Figure 13:
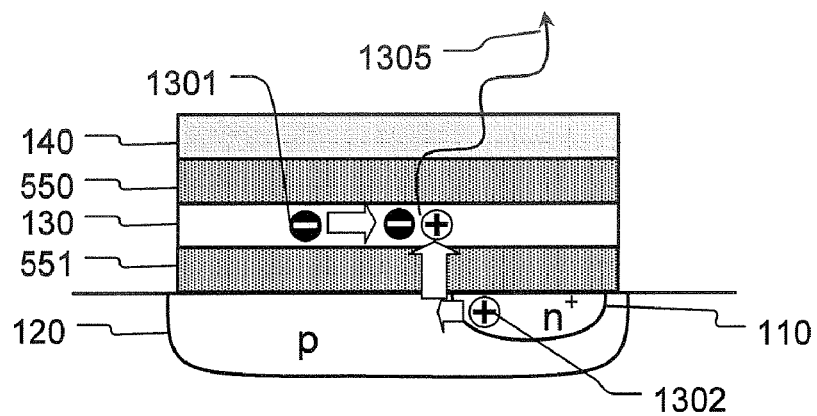
FIG. 13 shows a structural view of photon generation from a charge trapping structure by combination of a hole from an n+ contact region in a p-type body region and an electron from the charge trapping structure.

FIG. 13 shows a structural view of photon generation from a charge trapping structure by combination of a hole from an n+ contact region in a p-type body region and an electron from the charge trapping structure. The electroluminescent charge trapping device of FIG. 5 has an isolation dielectric 550 thickness of 7 nm, a charge trapping structure 130 thickness of 6 nm, and an isolation dielectric 551 thickness of 7 nm. The gate 140 is biased at −5 V, the n+ contact region 110 is biased at 7 V, and the p-type body region 120 is biased at 0 V. A hole 1302 is provided by band-to-band hot hole conduction from the n+ contact region 110, through the p-type body region 120 and the isolation dielectric 551, to the charge trapping structure 130. An electron 1301 is provided from the charge trapping structure 130. The hole 1302 and the electron 1301 combine in the charge trapping structure 130 to generate a photon 1305.

Figure 14:
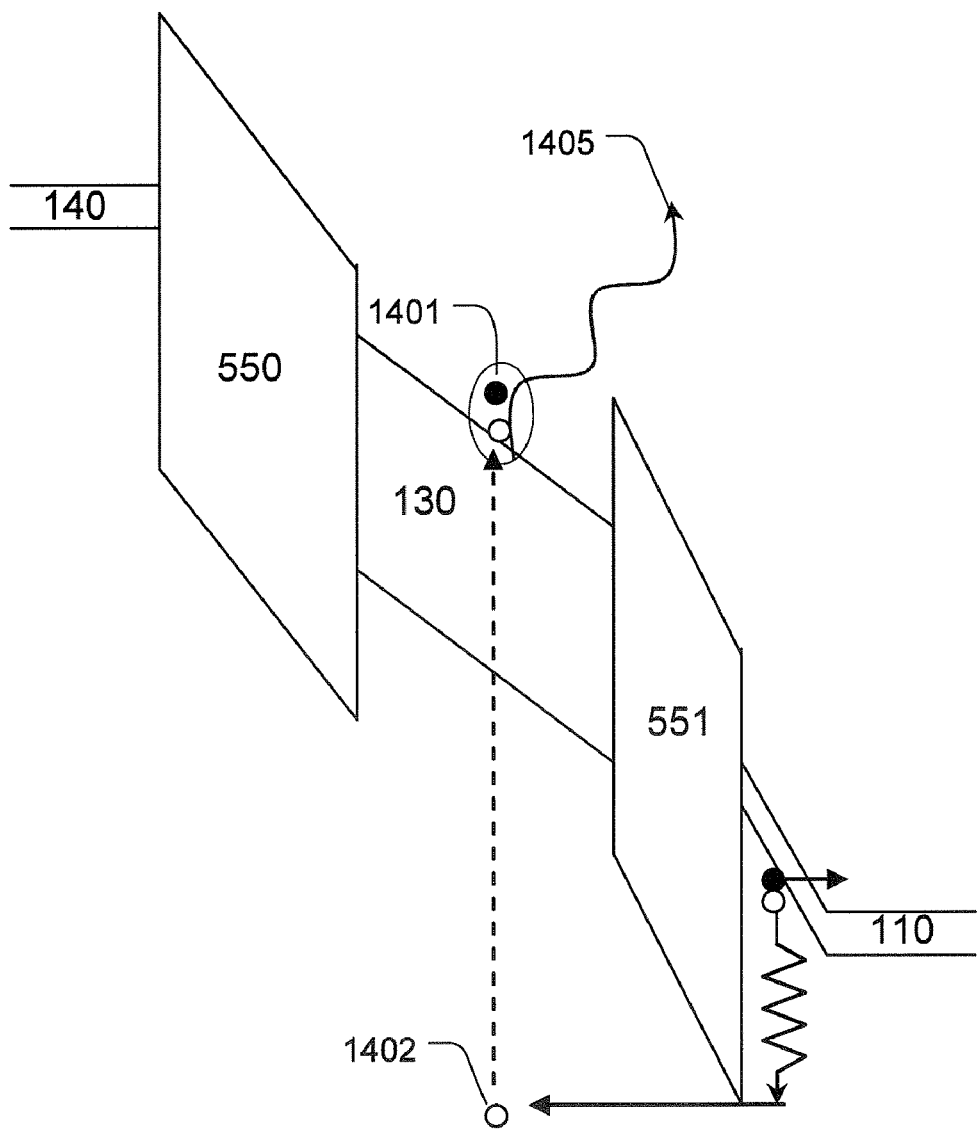
FIG. 14 shows a bandgap diagram of photon generation from a charge trapping structure by combination of a hole from an n+ contact region in a p-type body region and an electron from the charge trapping structure.

FIG. 14 shows a bandgap diagram version of FIG. 13 of photon generation from a charge trapping structure by combination of a hole from an n+ contact region in a p-type body region and an electron from the charge trapping structure. A hole 1402 is provided by band-to-band hot hole conduction from the n+ contact region 110, through the p-type body region 120 and the isolation dielectric 551, to the charge trapping structure 130. An electron 1401 is provided from the charge trapping structure 130. The hole 1402 and the electron 1401 combine in the charge trapping structure 130 to generate a photon 1405.

Figure 15:
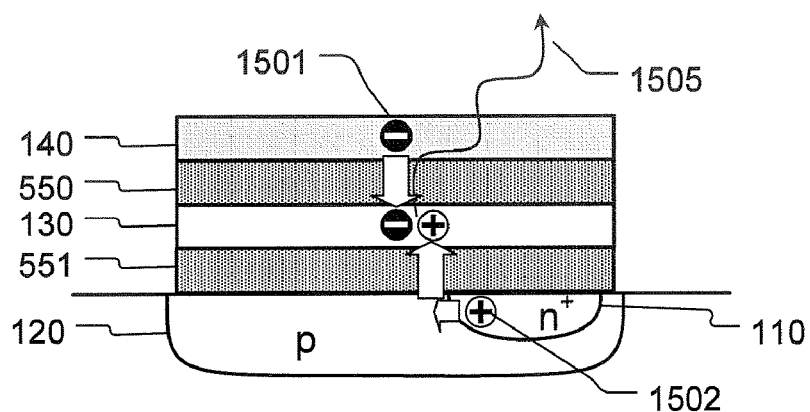
FIG. 15 shows a structural view of photon generation from a charge trapping structure by combination of a hole from an n+ contact region in a p-type body region and an electron from a gate.

FIG. 15 shows a structural view of photon generation from a charge trapping structure by combination of a hole from an n+ contact region in a p-type body region and an electron from a gate. The electroluminescent charge trapping device of FIG. 5 has an isolation dielectric 550 thickness of 7 nm, a charge trapping structure 130 thickness of 6 nm, and an isolation dielectric 551 thickness of 7 nm. The gate 140 is biased at −14 V, the n+ contact region 110 is biased at 7 V, and the p-type body region 120 is biased at 0 V. A hole 1502 is provided by band-to-band hot hole conduction from the n+ contact region 110, through the p-type body region 120 and the isolation dielectric 551, to the charge trapping structure 130. An electron 1501 is provided from a gate 140, through the isolation dielectric 550, to the charge trapping structure 130. The hole 1502 and the electron 1501 combine in the charge trapping structure 130 to generate a photon 1505.

Figure 16:
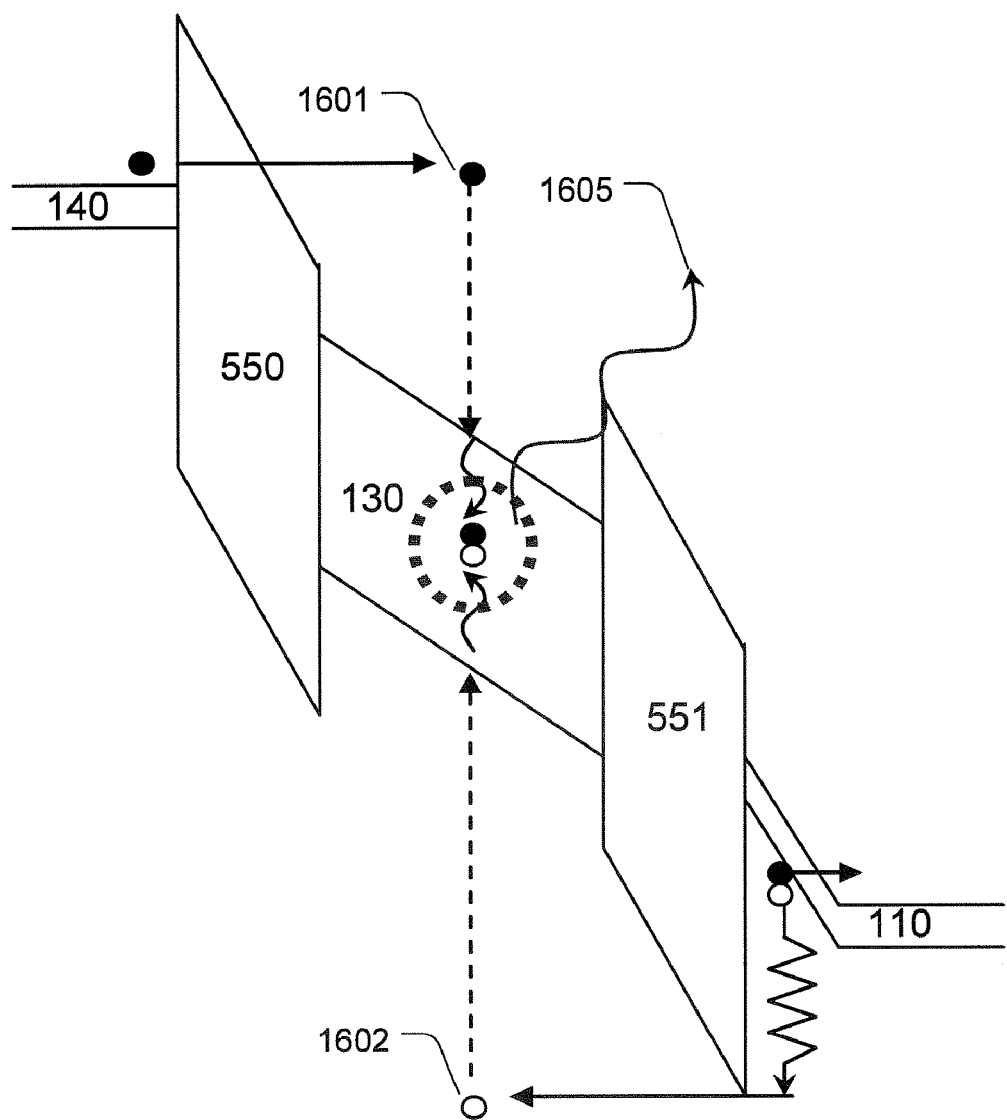
FIG. 16 shows a bandgap diagram of photon generation from a charge trapping structure by combination of a hole from an n+ contact region in a p-type body region and an electron from a gate.

FIG. 16 shows a bandgap diagram version of FIG. 15 of photon generation from a charge trapping structure by combination of a hole from an n+ contact region in a p-type body region and an electron from a gate. A hole 1602 is provided by band-to-band hot hole conduction from the n+ contact region 110, through the p-type body region 120 and the isolation dielectric 551, to the charge trapping structure 130. An electron 1601 is provided from a gate 140, through the isolation dielectric 550, to the charge trapping structure 130. The hole 1602 and the electron 1601 combine in the charge trapping structure 130 to generate a photon 1605.

Figure 17:
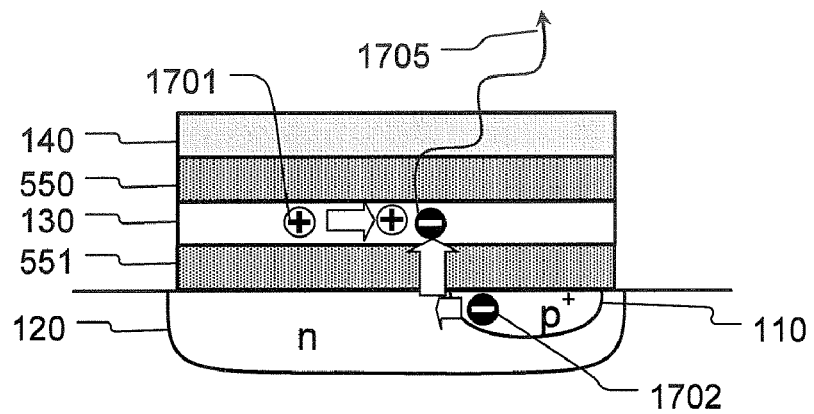
FIG. 17 shows a structural view of photon generation from a charge trapping structure by combination of an electron from a p+ contact region in an n-type body region and a hole from the charge trapping structure.

FIG. 17 shows a structural view of photon generation from a charge trapping structure by combination of an electron from a p+ contact region in an n-type body region and a hole from the charge trapping structure. The electroluminescent charge trapping device of FIG. 5 has an isolation dielectric 550 thickness of 7 nm, a charge trapping structure 130 thickness of 6 nm, and an isolation dielectric 551 thickness of 7 nm. The gate 140 is biased at 5 V, the p+ contact region 110 is biased at −7 V, and the n-type body region 120 is biased at 0 V. An electron 1702 is provided by band-to-band hot electron conduction from the p+ contact region 110, through the n-type body region 120 and the isolation dielectric 551, to the charge trapping structure 130. A hole 1701 is provided from the charge trapping structure 130. The electron 1702 and the hole 1701 combine in the charge trapping structure 130 to generate a photon 1705.

Figure 18:
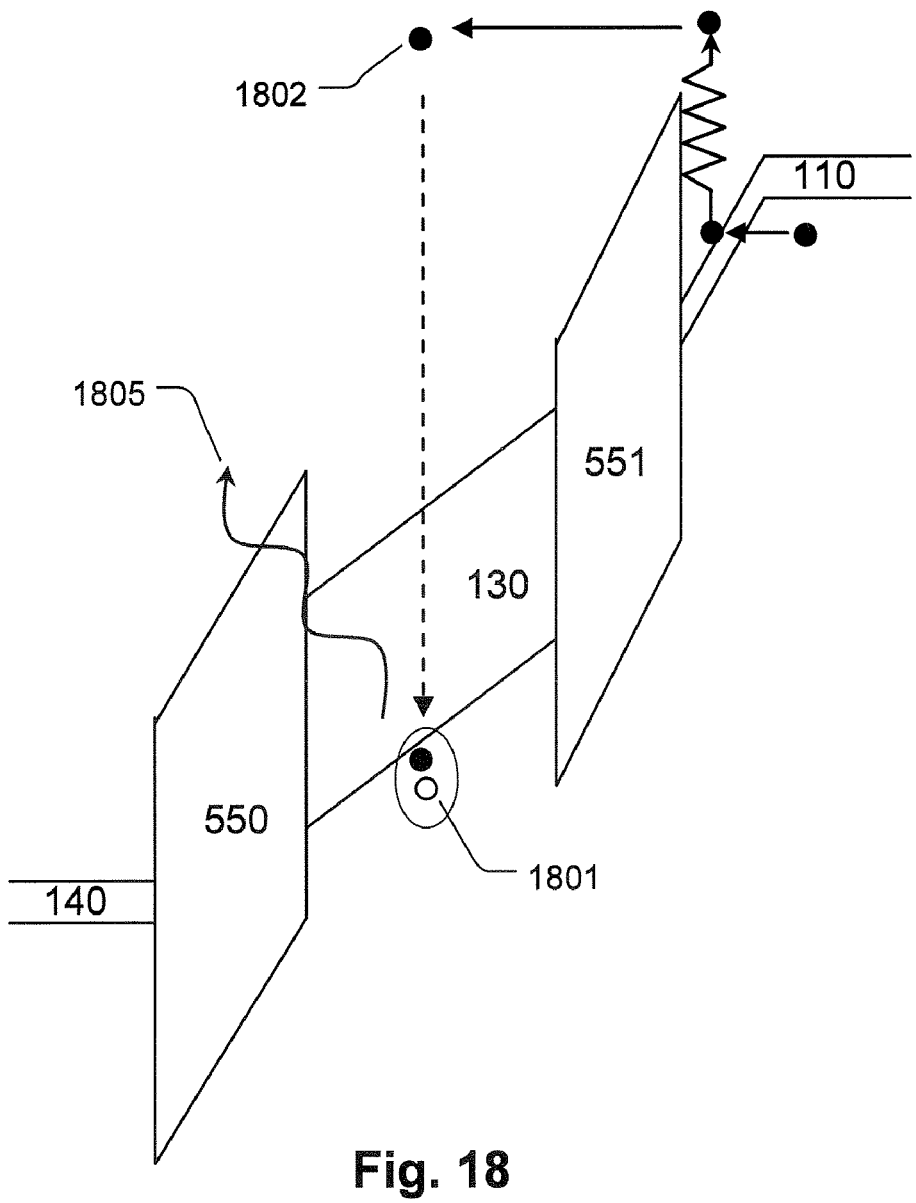
FIG. 18 shows a bandgap diagram of photon generation from a charge trapping structure by combination of an electron from a p+ contact region in an n-type body region and a hole from the charge trapping structure.

FIG. 18 shows a bandgap diagram version of FIG. 17 of photon generation from a charge trapping structure by combination of an electron from a p+ contact region in an n-type body region and a hole from the charge trapping structure. An electron 1802 is provided by band-to-band hot electron conduction from the p+ contact region 110, through the n-type body region 120 and the isolation dielectric 551, to the charge trapping structure 130. A hole 1801 is provided from the charge trapping structure 130. The electron 1802 and the hole 1801 combine in the charge trapping structure 130 to generate a photon 1805.

Figure 19:
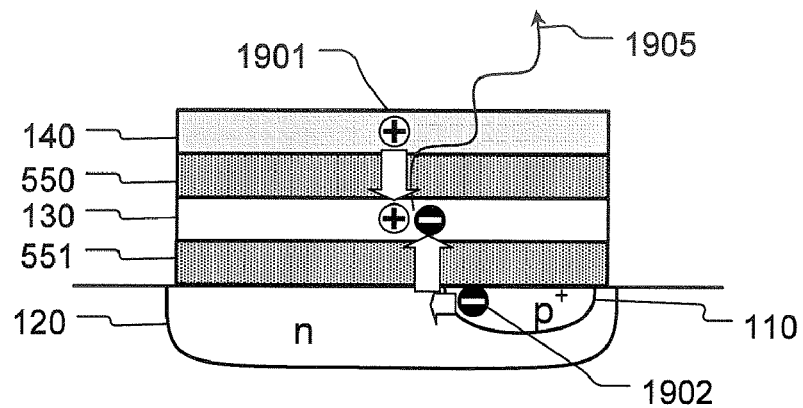
FIG. 19 shows a structural view of photon generation from a charge trapping structure by combination of an electron from a p+ contact region in an n-type body region and a hole from a gate.

FIG. 19 shows a structural view of photon generation from a charge trapping structure by combination of an electron from a p+ contact region in an n-type body region and a hole from a gate. The electroluminescent charge trapping device of FIG. 5 has an isolation dielectric 550 thickness of 2 nm, a charge trapping structure 130 thickness of 6 nm, and an isolation dielectric 551 thickness of 7 nm. The gate 140 is biased at 14 V, the p+ contact region 110 is biased at −7 V, and the n-type body region 120 is biased at 0 V. An electron 1902 is provided by band-to-band hot electron conduction from the p+ contact region 110, through the n-type body region 120 and the isolation dielectric 551, to the charge trapping structure 130. A hole 1901 is provided from the gate 140, through the isolation dielectric 550, to the charge trapping structure 130. The electron 1902 and the hole 1901 combine in the charge trapping structure 130 to generate a photon 1905.

Figure 20:
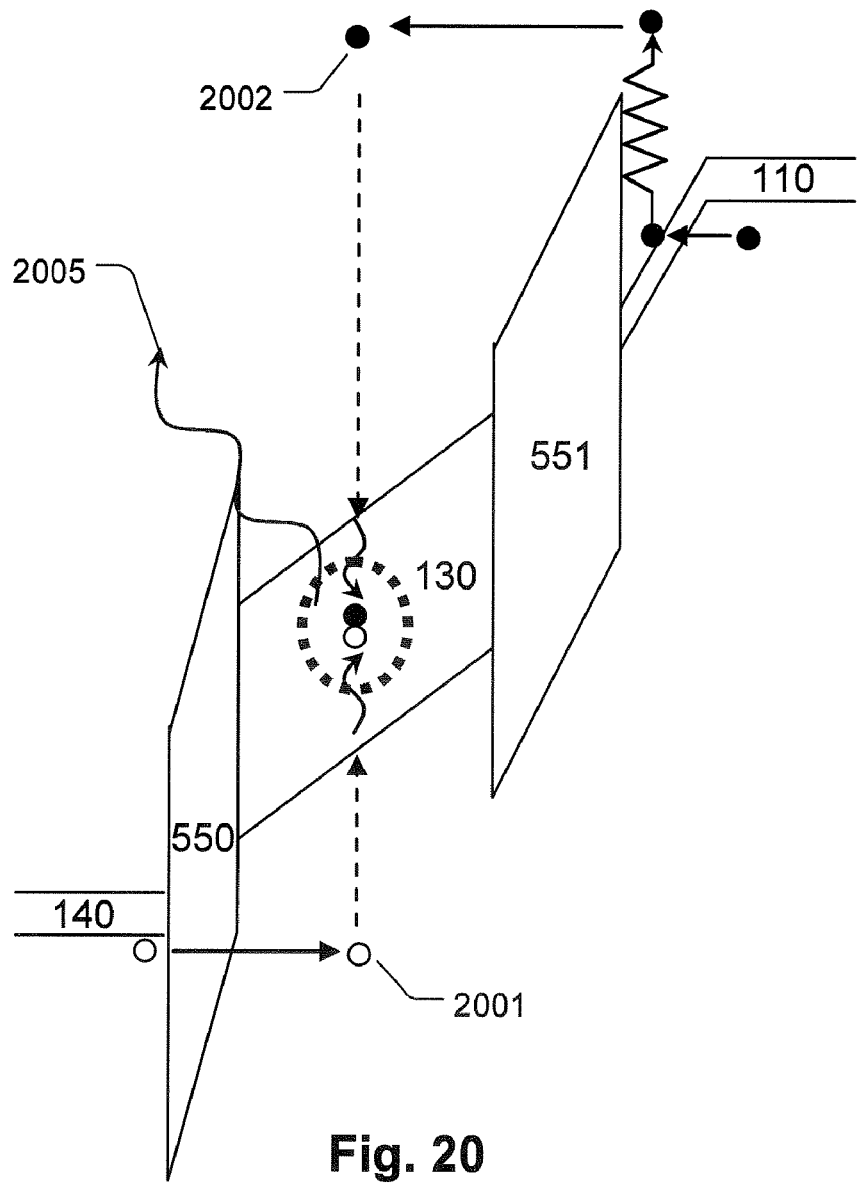
FIG. 20 shows a bandgap diagram of photon generation from a charge trapping structure by combination of an electron from a p+ contact region in an n-type body region and a hole from a gate.

FIG. 20 shows a bandgap diagram version of FIG. 19 of photon generation from a charge trapping structure by combination of an electron from a p+ contact region in an n-type body region and a hole from a gate. An electron 2002 is provided by band-to-band hot electron conduction from the p+ contact region 110, through the n-type body region 120 and the isolation dielectric 551, to the charge trapping structure 130. A hole 2001 is provided from the gate 140, through the isolation dielectric 550, to the charge trapping structure 130. The electron 2002 and the hole 2001 combine in the charge trapping structure 130 to generate a photon 2005.

Figure 21:
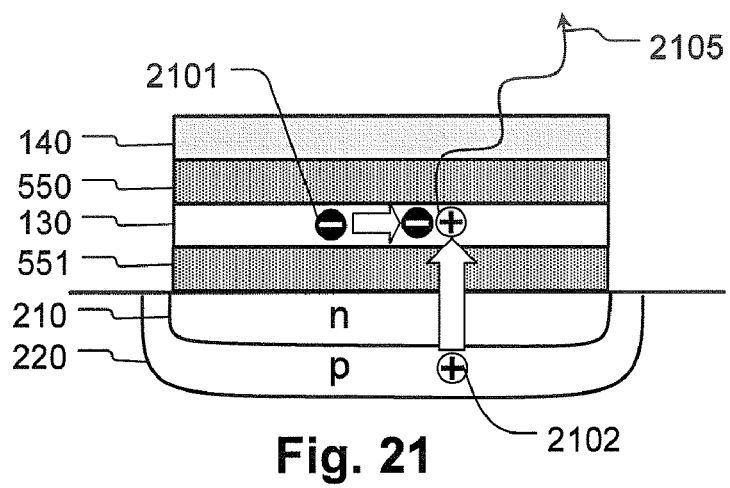
FIG. 21 shows a structural view of photon generation from a charge trapping structure by combination of a hole from a p-type substrate region through an n-type well region and an electron from the charge trapping structure.

FIG. 21 shows a structural view of photon generation from a charge trapping structure by combination of a hole from a p-type substrate region through an n-type well region and an electron from the charge trapping structure. The electroluminescent charge trapping device of FIG. 10 has an isolation dielectric 550 thickness of 7 nm, a charge trapping structure 130 thickness of 6 nm, and an isolation dielectric 551 thickness of 7 nm. The gate 140 is biased at −5 V, the n-type well region 210 is biased at 5 V, and the p-type substrate region 220 is biased at 6 V. A hole 2102 is provided by hot hole conduction from the p-type substrate region 220, through the n-type well region 210 and the isolation dielectric 551, to the charge trapping structure 130. An electron 2101 is provided from the charge trapping structure 130. The hole 2102 and the electron 2101 combine in the charge trapping structure 130 to generate a photon 2105.

Figure 22:
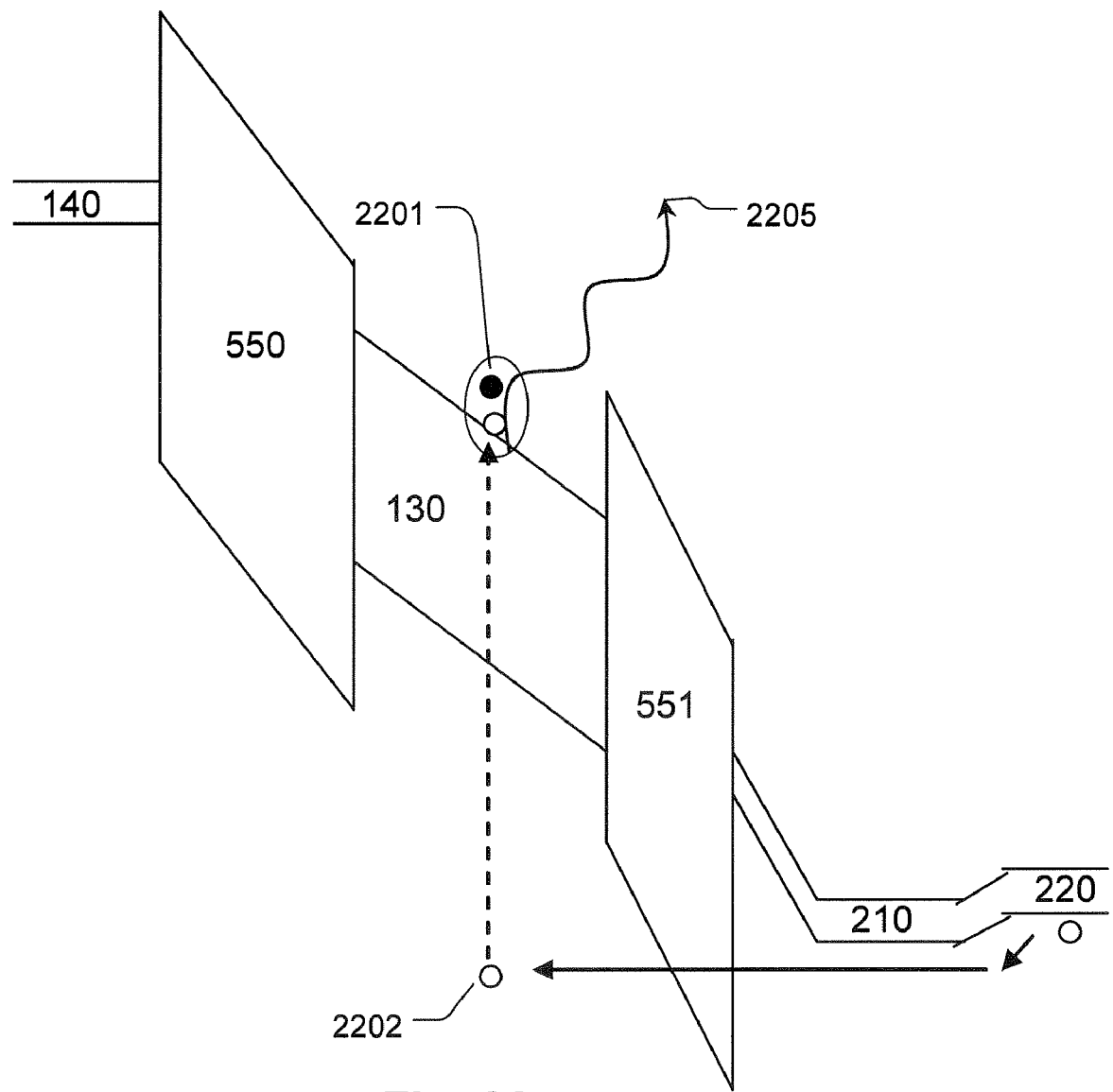
FIG. 22 shows a bandgap diagram of photon generation from a charge trapping structure by combination of a hole from a p-type substrate region through an n-type well region and an electron from the charge trapping structure.

FIG. 22 shows a bandgap diagram version of FIG. 21 of photon generation from a charge trapping structure by combination of a hole from a p-type substrate region through an n-type well region and an electron from the charge trapping structure. A hole 2202 is provided by hot hole conduction from the p-type substrate region 220, through the n-type well region 210 and the isolation dielectric 551, to the charge trapping structure 130. An electron 2201 is provided from the charge trapping structure 130. The hole 2202 and the electron 2201 combine in the charge trapping structure 130 to generate a photon 2205.

Figure 23:
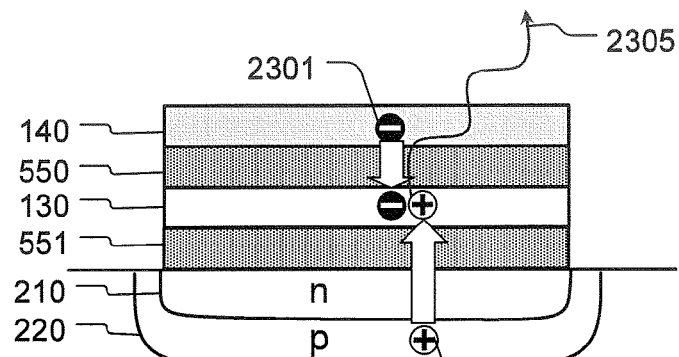
FIG. 23 shows a structural view of photon generation from a charge trapping structure by combination of a hole from a p-type substrate region through an n-type well region and an electron from a gate.

FIG. 23 shows a structural view of photon generation from a charge trapping structure by combination of a hole from a p-type substrate region through an n-type well region and an electron from a gate. The electroluminescent charge trapping device of FIG. 10 has an isolation dielectric 550 thickness of 7 nm, a charge trapping structure 130 thickness of 6 nm, and an isolation dielectric 551 thickness of 7 nm. The gate 140 is biased at −10 V, the n-type well region 210 is biased at 5 V, and the p-type substrate region 220 is biased at 6 V. A hole 2302 is provided by hot hole conduction from the p-type substrate region 220, through the n-type well region 210 and the isolation dielectric 551, to the charge trapping structure 130. An electron 2301 is provided from the gate 140, through the isolation dielectric 550, to the charge trapping structure 130. The hole 2302 and the electron 2301 combine in the charge trapping structure 130 to generate a photon 2305.

Figure 24:
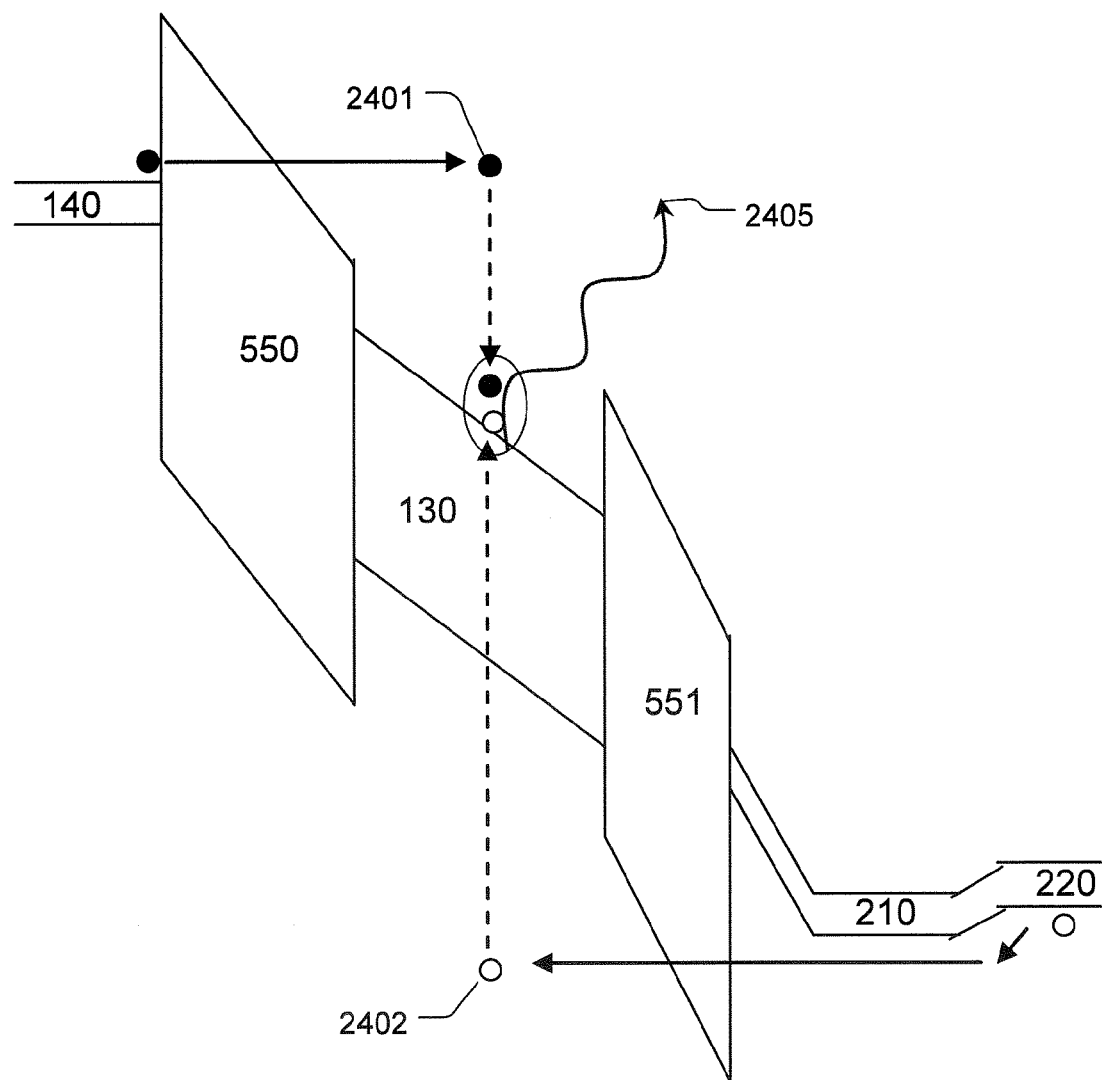
FIG. 24 shows a bandgap diagram of photon generation from a charge trapping structure by combination of a hole from a p-type substrate region through an n-type well region and an electron from a gate.

FIG. 24 shows a bandgap diagram version of FIG. 23 of photon generation from a charge trapping structure by combination of a hole from a p-type substrate region through an n-type well region and an electron from a gate. A hole 2402 is provided by hot hole conduction from the p-type substrate region 220, through the n-type well region 210 and the isolation dielectric 551, to the charge trapping structure 130. An electron 2401 is provided from the gate 140, through the isolation dielectric 550, to the charge trapping structure 130.

The hole 2402 and the electron 2401 combine in the charge trapping structure 130 to generate a photon 2405.

Figure 25:
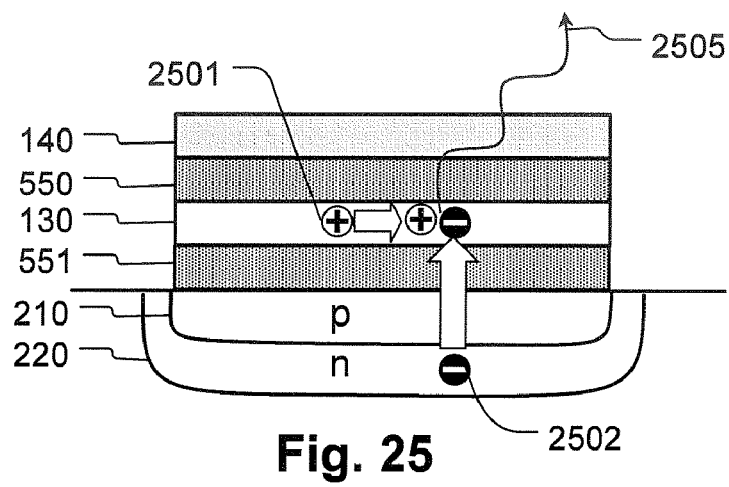
FIG. 25 shows a structural view of photon generation from a charge trapping structure by combination of an electron from an n-type substrate region through a p-type well region and a hole from the charge trapping structure.

FIG. 25 shows a structural view of photon generation from a charge trapping structure by combination of an electron from an n-type substrate region through a p-type well region and a hole from the charge trapping structure. The electroluminescent charge trapping device of FIG. 10 has an isolation dielectric 550 thickness of 7 nm, a charge trapping structure 130 thickness of 6 n, and an isolation dielectric 551 thickness of 7 nm. The gate 140 is biased at 5 V, the p-type well region 210 is biased at −5 V, and the n-type substrate region 220 is biased at −6 V. An electron 2502 is provided by hot electron conduction from the n-type substrate region 220, through the p-type well region 210 and the isolation dielectric 551, to the charge trapping structure 130. A hole 2501 is provided from the charge trapping structure 130. The electron 2502 and the hole 2501 combine in the charge trapping structure 130 to generate a photon 2505.

Figure 26:
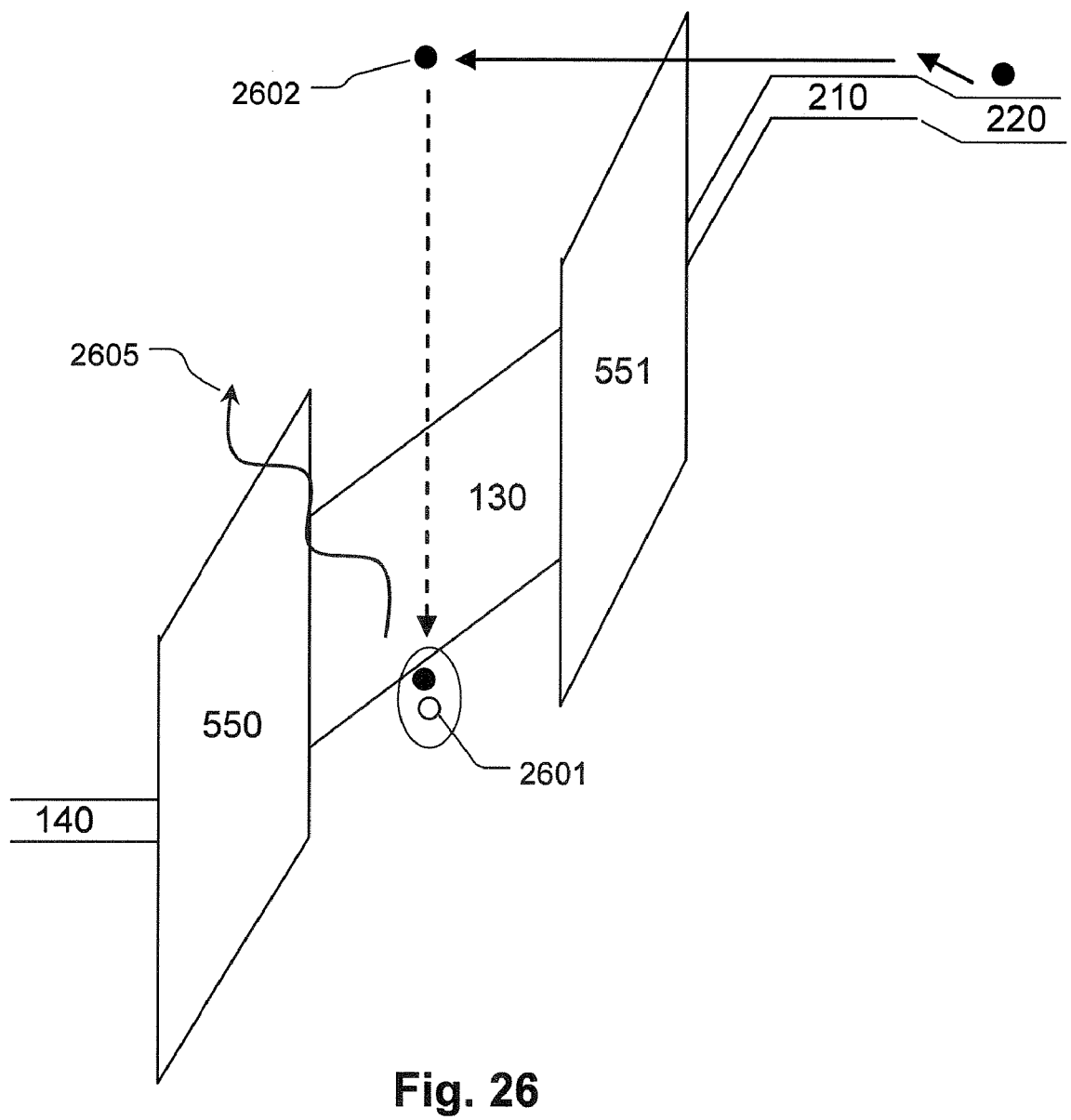
FIG. 26 shows a bandgap diagram of photon generation from a charge trapping structure by combination of an electron from an n-type substrate region through a p-type well region and a hole from the charge trapping structure.

FIG. 26 shows a bandgap diagram version of FIG. 25 of photon generation from a charge trapping structure by combination of an electron from an n-type substrate region through a p-type well region and a hole from the charge trapping structure. An electron 2602 is provided by hot electron conduction from the n-type substrate region 220, through the p-type well region 210 and the isolation dielectric 551, to the charge trapping structure 130. A hole 2601 is provided from the charge trapping structure 130. The electron 2602 and the hole 2601 combine in the charge trapping structure 130 to generate a photon 2605.

Figure 27:
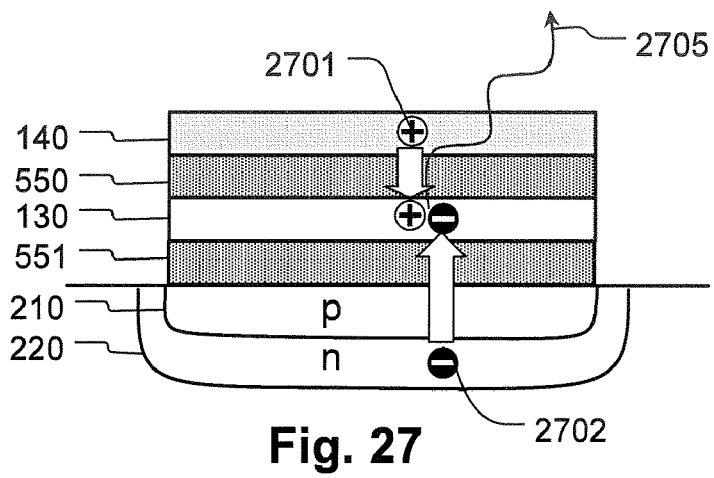
FIG. 27 shows a structural view of photon generation from a charge trapping structure by combination of an electron from an n-type substrate region through a p-type well region and a hole from a gate.

FIG. 27 shows a structural view of photon generation from a charge trapping structure by combination of an electron from an n-type substrate region through a p-type well region and a hole from a gate. The electroluminescent charge trapping device of FIG. 10 has an isolation dielectric 550 thickness of 2 nm, a charge trapping structure 130 thickness of 6 nm, and an isolation dielectric 551 thickness of 7 nm. The gate 140 is biased at 10 V, the p-type well region 210 is biased at −5 V, and the n-type substrate region 220 is biased at −6 V. An electron 2702 is provided by hot electron conduction from the n-type substrate region 220, through the p-type well region 210 and the isolation dielectric 551, to the charge trapping structure 130. A hole 2701 is provided from the gate 140, through the isolation dielectric 550, to the charge trapping structure 130. The electron 2702 and the hole 2701 combine in the charge trapping structure 130 to generate a photon 2705.

Figure 28:
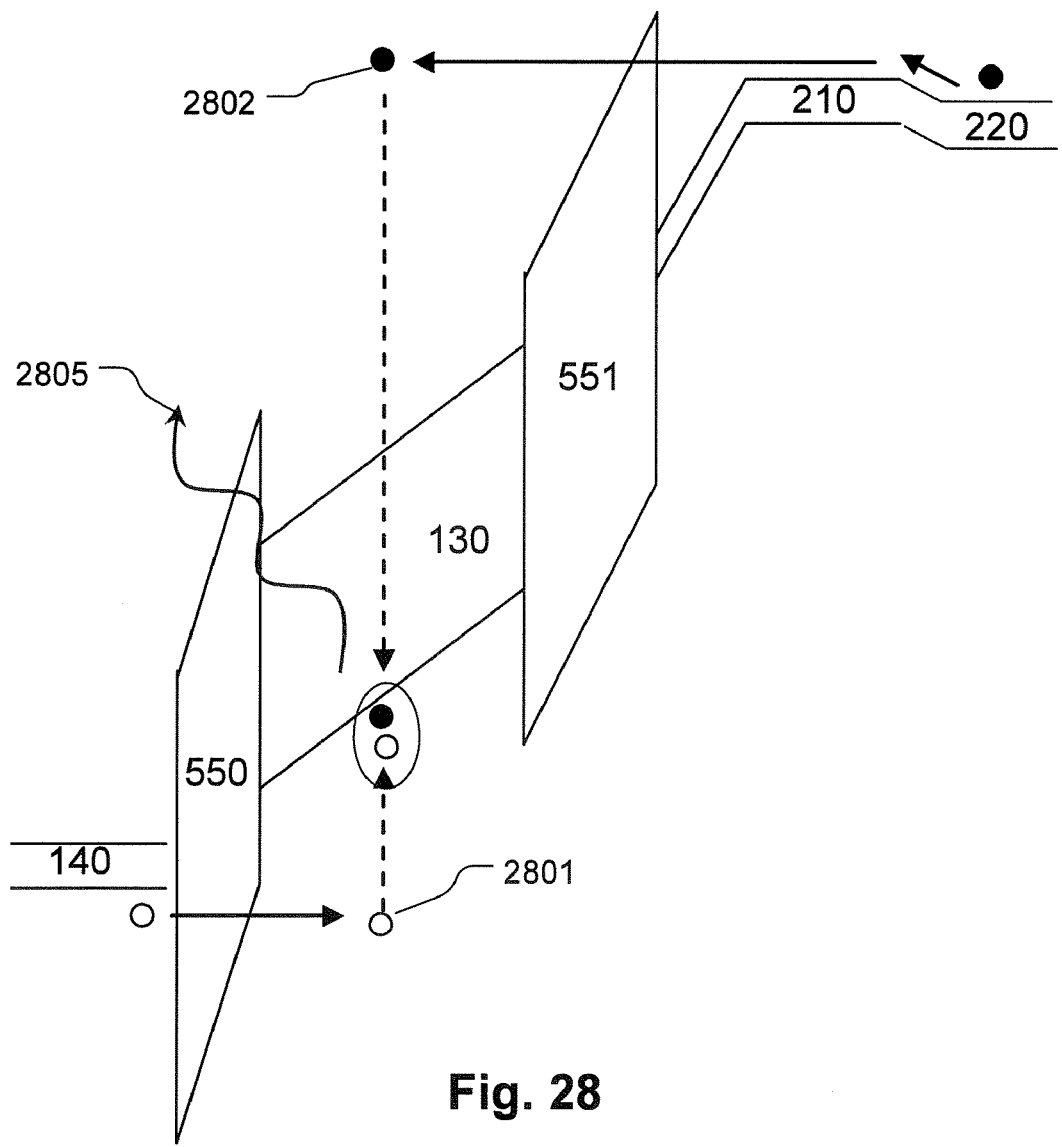
FIG. 28 shows a bandgap diagram of photon generation from a charge trapping structure by combination of an electron from an n-type substrate region through a p-type well region and a hole from a gate.

FIG. 28 shows a bandgap diagram version of FIG. 27 of photon generation from a charge trapping structure by combination of an electron from an n-type substrate region through a p-type well region and a hole from a gate. An electron 2802 is provided by hot electron conduction from the n-type substrate region 220, through the p-type well region 210 and the isolation dielectric 551, to the charge trapping structure 130. A hole 2801 is provided from the gate 140, through the isolation dielectric 550, to the charge trapping structure 130. The electron 2802 and the hole 2801 combine in the charge trapping structure 130 to generate a photon 2805.

Figure 29:
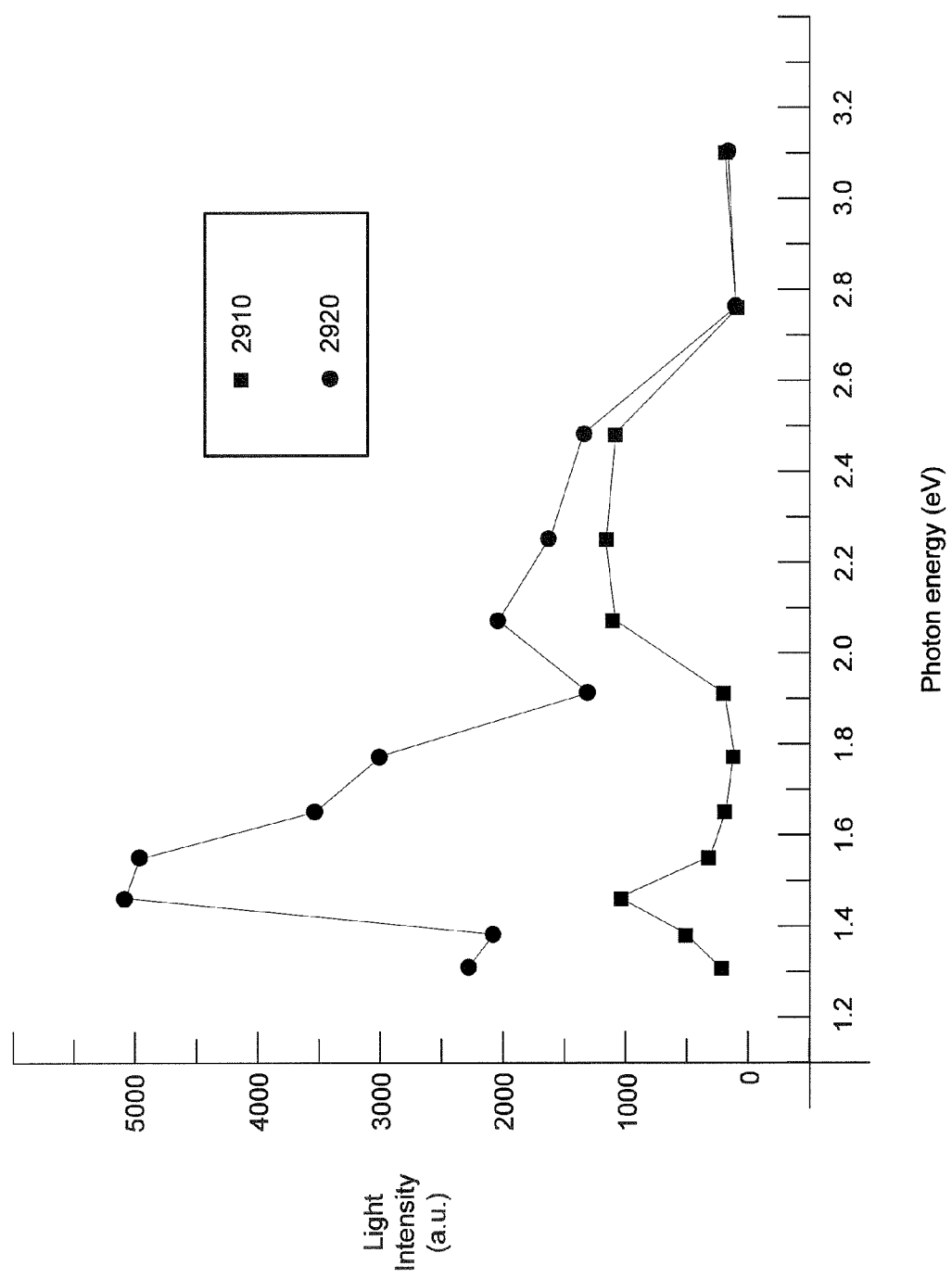
FIG. 29 is a graph of experimental data comparing background photon intensity versus photon intensity from combination of holes from an n+ contact region in a p-type body region and an electron from a gate

FIG. 29 is a graph of experimental data comparing background photon intensity versus photon intensity from combination of holes from an n+ contact region in a p-type body region and an electron from a gate. Curve 2910 shows the background photon intensity versus photon energy. Curve 2920 shows the photon intensity from combination of holes from an n+ contact region in a p-type body region and an electron from a gate. A bias of −14 V is applied to the gate. A bias of 5 V is applied to the n+ contact region. A bias of 0 V is applied to the p-type body region.

Figure 30:
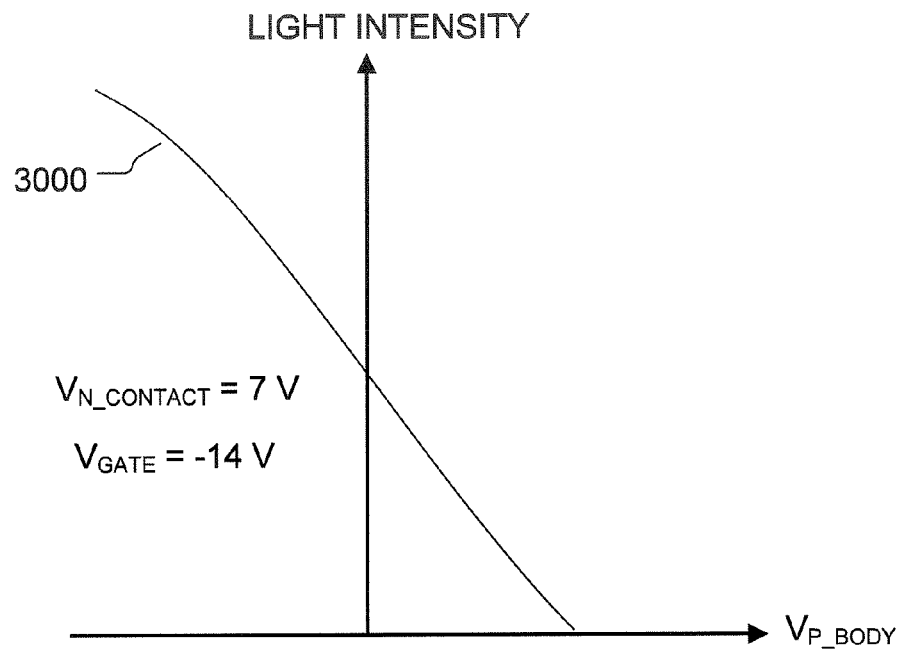
FIG. 30 is a graph of light intensity versus p-type body region voltage for a fixed n+ contact region voltage and fixed gate voltage.

FIG. 30 is a graph of light intensity versus p-type body region voltage for a fixed n+ contact region voltage and fixed gate voltage. A bias of −14 V is applied to the gate. A bias of 7 V is applied to the n+ contact region. The bias applied to the p-type body region is varied between −2 V and 7 V. As the magnitude of reverse bias between the p-type body region and the n+ contact region increases, more photons are generated from the charge trapping structure. Similarly, as the magnitude of reverse bias between the p-type body region and the n+ contact region decreases, fewer photons are generated from the charge trapping structure.

Figure 31:
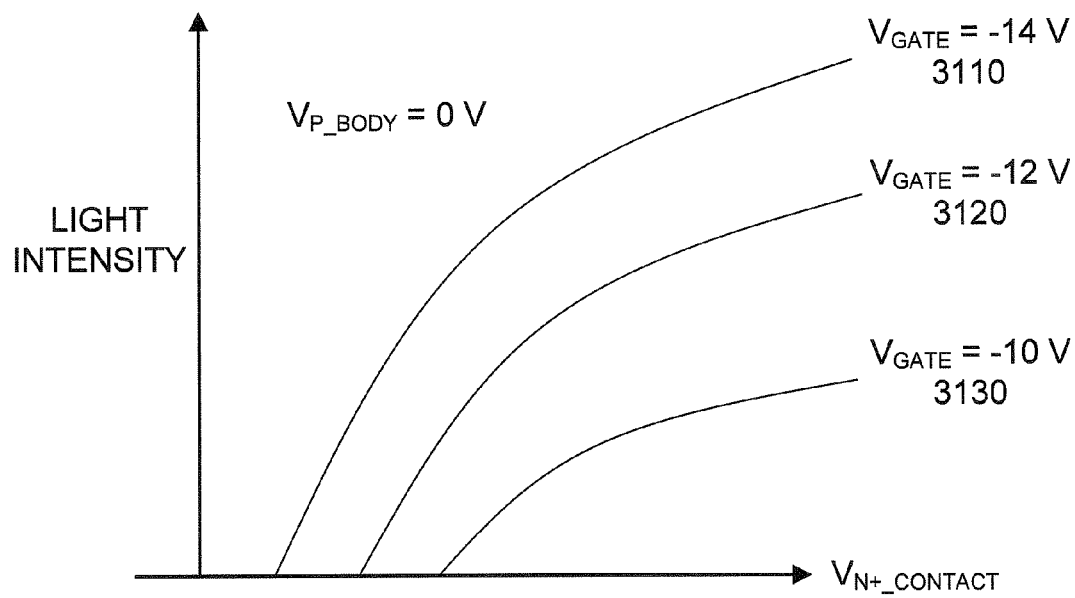
FIG. 31 is a graph of a set of curves of light intensity versus n+ contact region voltage, for a fixed p-type body region and fixed gate voltage per curve. One effect shown is that an increasing electric field magnitude between the gate and the body region generates more photons from the charge trapping structure, and a decreasing electric field magnitude between the gate and the body region generates fewer photons from the charge trapping structure.

FIG. 31 is a graph of a set of curves of light intensity versus n+ contact region voltage, for a fixed p-type body region and fixed gate voltage per curve. One effect shown is that an increasing electric field magnitude between the gate and the body region generates more photons from the charge trapping structure, and a decreasing electric field magnitude between the gate and the body region generates fewer photons from the charge trapping structure. The bias applied to the p-type body region is 0 V. Curve 3110 corresponds to applying a bias of −14 V to the gate. Curve 3120 corresponds to applying a bias of −12 V to the gate. Curve 3130 corresponds to applying a bias of −10 V to the gate. The bias applied to the n+ contact region is varied between 0 V and 7 V.

Figure 32:
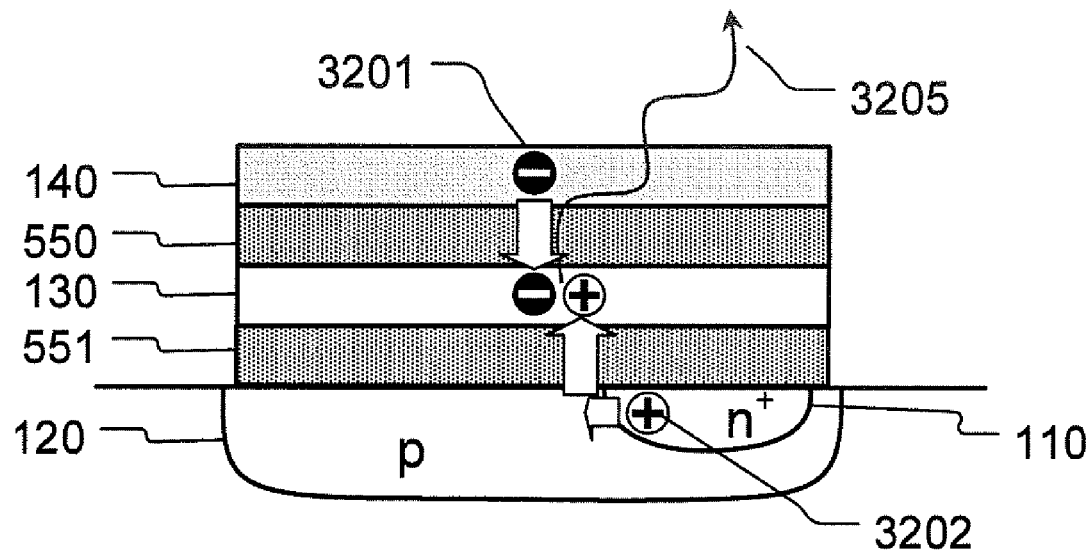
FIG. 32 shows an operating condition of an electroluminescent charge trapping device with an n+ contact region in a p-type body region, in which relative to FIG. 33, there is an increased magnitude of reverse bias between the contact region and the body region, such that more photons are generated from the charge trapping structure.
Figure 33:
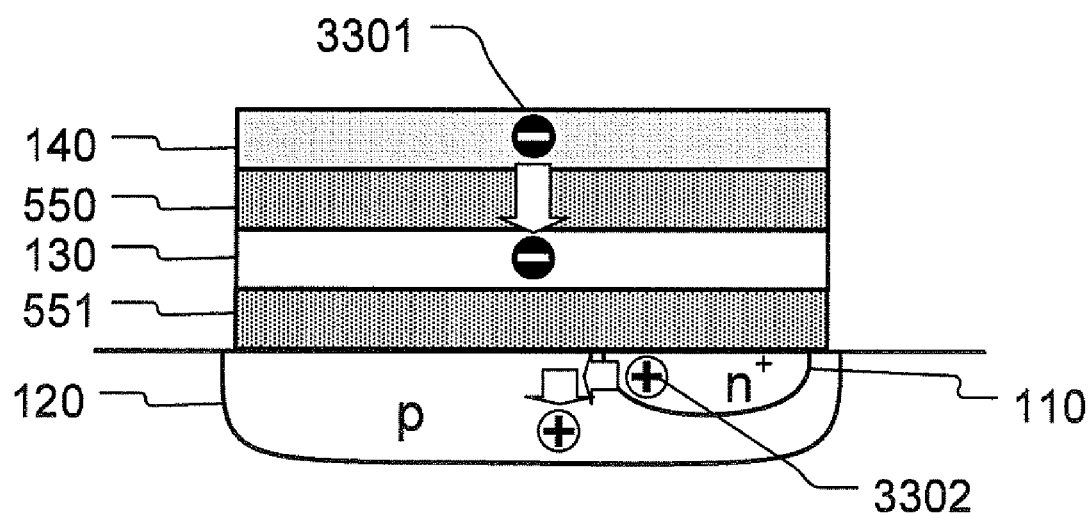
FIG. 33 shows an operating condition of an electroluminescent charge trapping device with an n+ contact region in a p-type body region, in which relative to FIG. 32, there is a decreased magnitude of reverse bias between the contact region and the body region, such that fewer photons are generated from the charge trapping structure.

FIGS. 32 and 33 show the electroluminescent device of FIG. 15. FIG. 32 shows an operating condition of an electroluminescent charge trapping device with an n+ contact region in a p-type body region, in which relative to FIG. 33, there is an increased magnitude of reverse bias between the contact region and the body region, such that more photons are generated from the charge trapping structure. FIG. 33 shows an operating condition of an electroluminescent charge trapping device with an n+ contact region in a p-type body region, in which relative to FIG. 32, there is a decreased magnitude of reverse bias between the contact region and the body region, such that fewer photons are generated from the charge trapping structure. For example, applying a bias of 6 V to the p-type body region 120 reduces the reverse bias between the p-type body region 120 and the n+ contact region 110 such that band-to-band hot hole conduction does not occur. The absence of band-to-band hot hole conduction reduces the supply of holes to the charge trapping structure 120, and reduces the combination of electrons and holes in the charge trapping structure 120 that causes photon generation.

Figure 34:
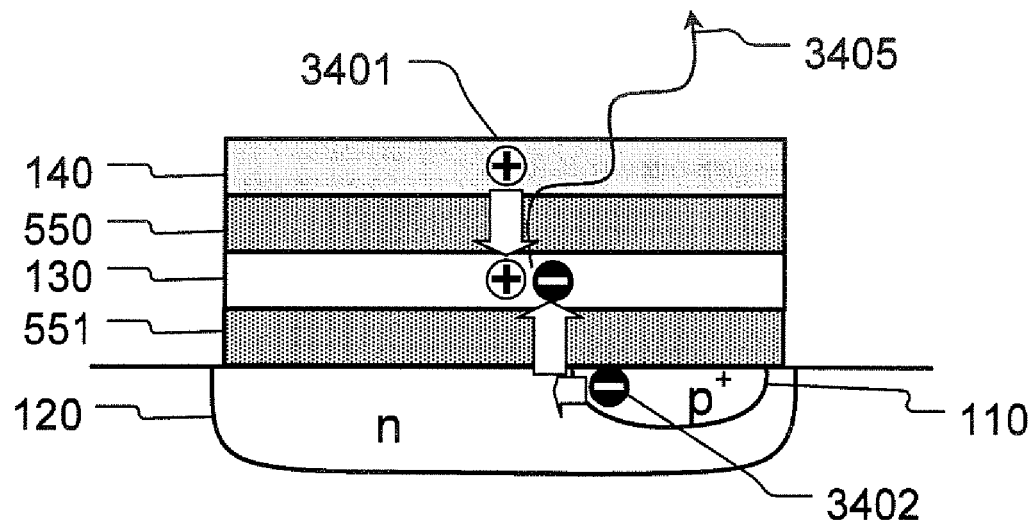
FIG. 34 shows an operating condition of an electroluminescent charge trapping device with a p+ contact region in an n-type body region, in which relative to FIG. 35, there is an increased magnitude of reverse bias between the contact region and the body region, such that more photons are generated from the charge trapping structure.
Figure 35:
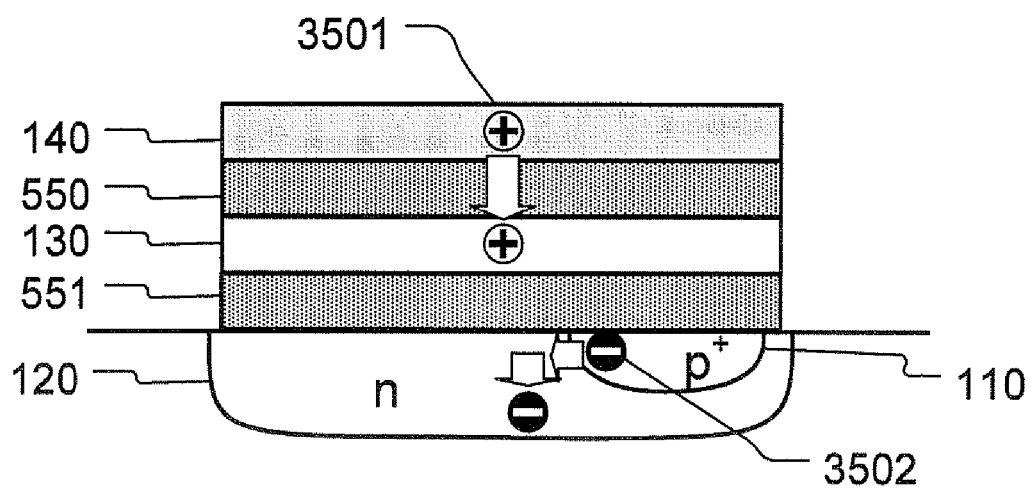
FIG. 35 shows an operating condition of an electroluminescent charge trapping device with a p+ contact region in an n-type body region, in which relative to FIG. 34, there is a decreased magnitude of reverse bias between the contact region and the body region, such that fewer photons are generated from the charge trapping structure.

FIGS. 34 and 35 show the electroluminescent device of FIG. 19. FIG. 34 shows an operating condition of an electroluminescent charge trapping device with a p+ contact region in an n-type body region, in which relative to FIG. 35, there is an increased magnitude of reverse bias between the contact region and the body region, such that more photons are generated from the charge trapping structure. FIG. 35 shows an operating condition of an electroluminescent charge trapping device with a p+ contact region in an n-type body region, in which relative to FIG. 34, there is a decreased magnitude of reverse bias between the contact region and the body region, such that fewer photons are generated from the charge trapping structure. For example, applying a bias of −6 V to the n-type body region 120 reduces the reverse bias between the n-type body region 120 and the p+ contact region 110 such that band-to-band hot electron conduction does not occur. The absence of band-to-band hot electron conduction reduces the supply of electrons to the charge trapping structure 120, and reduces the combination of electrons and holes in the charge trapping structure 120 that causes photon generation.

Figure 36:
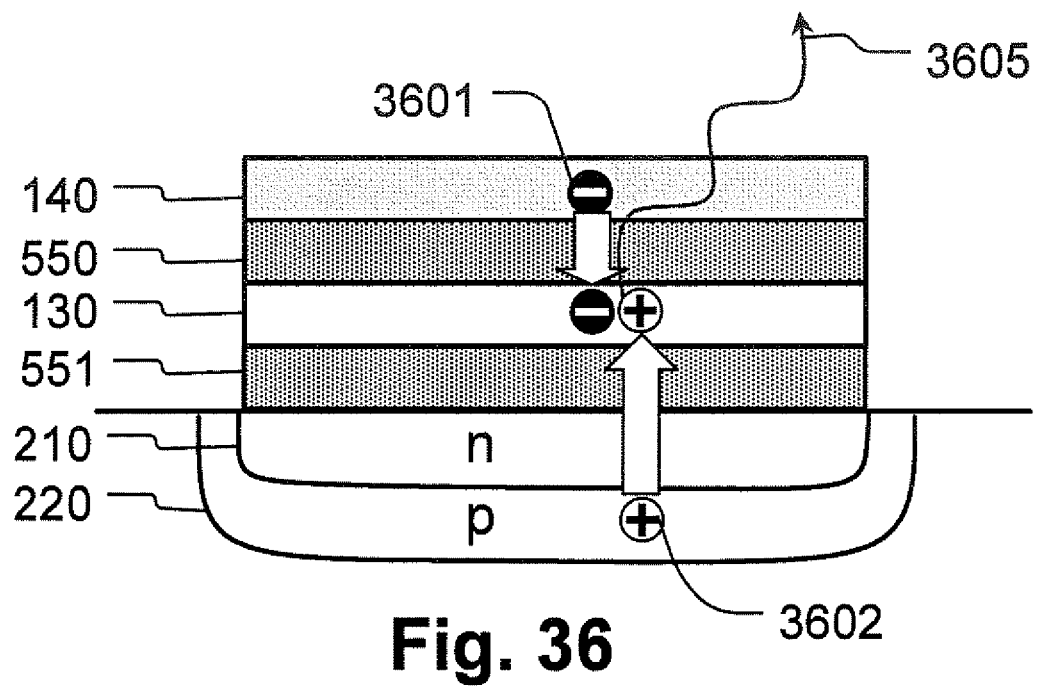
FIG. 36 shows an operating condition of an electroluminescent charge trapping device with an n-type well region in a p-type substrate region, in which relative to FIG. 37, there is an increased magnitude of forward bias between the well region and the substrate region, such that more photons are generated from the charge trapping structure.
Figure 37:
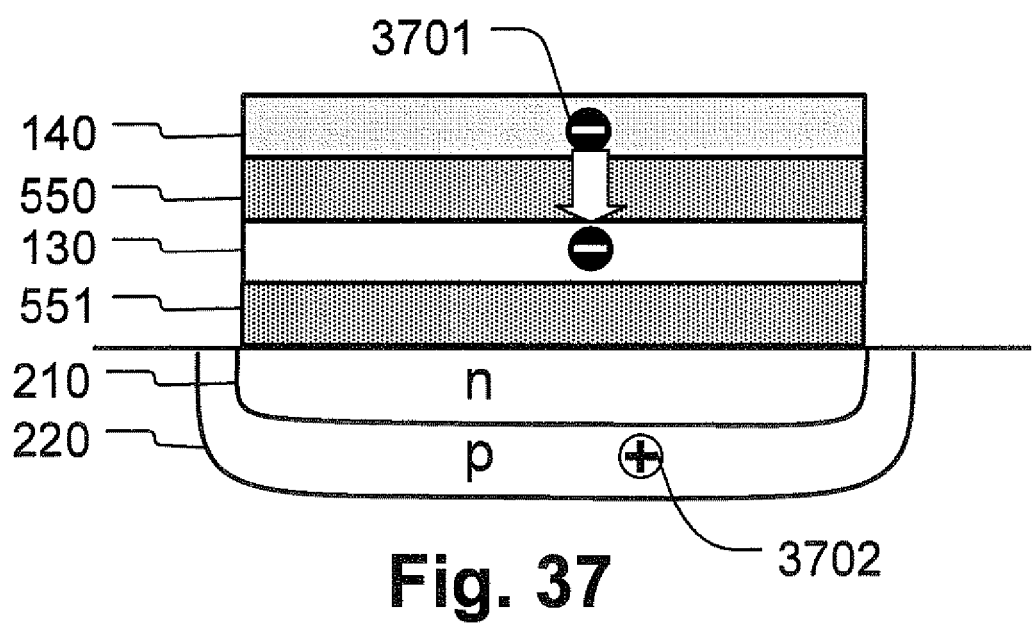
FIG. 37 shows an operating condition of an electroluminescent charge trapping device with an n-type well region in a p-type substrate region, in which relative to FIG. 36, there is a decreased magnitude of forward bias between the well region and the substrate region, such that fewer photons are generated from the charge trapping structure.

FIGS. 36 and 37 show the electroluminescent device of FIG. 23. FIG. 36 shows an operating condition of an electroluminescent charge trapping device with an n-type well region in a p-type substrate region, in which relative to FIG. 37, there is an increased magnitude of forward bias between the well region and the substrate region, such that more photons are generated from the charge trapping structure. FIG. 37 shows an operating condition of an electroluminescent charge trapping device with an n-type well region in a p-type substrate region, in which relative to FIG. 36, there is a decreased magnitude of forward bias between the well region and the substrate region, such that fewer photons are generated from the charge trapping structure. For example, applying a bias of 5 V to the p-type substrate region 220 reduces the forward bias between the p-type substrate region 220 and the n-type well region 210 such that hot hole conduction does not occur. The absence of hot hole conduction reduces the supply of holes to the charge trapping structure 120, and reduces the combination of electrons and holes in the charge trapping structure 120 that causes photon generation.

Figure 38:
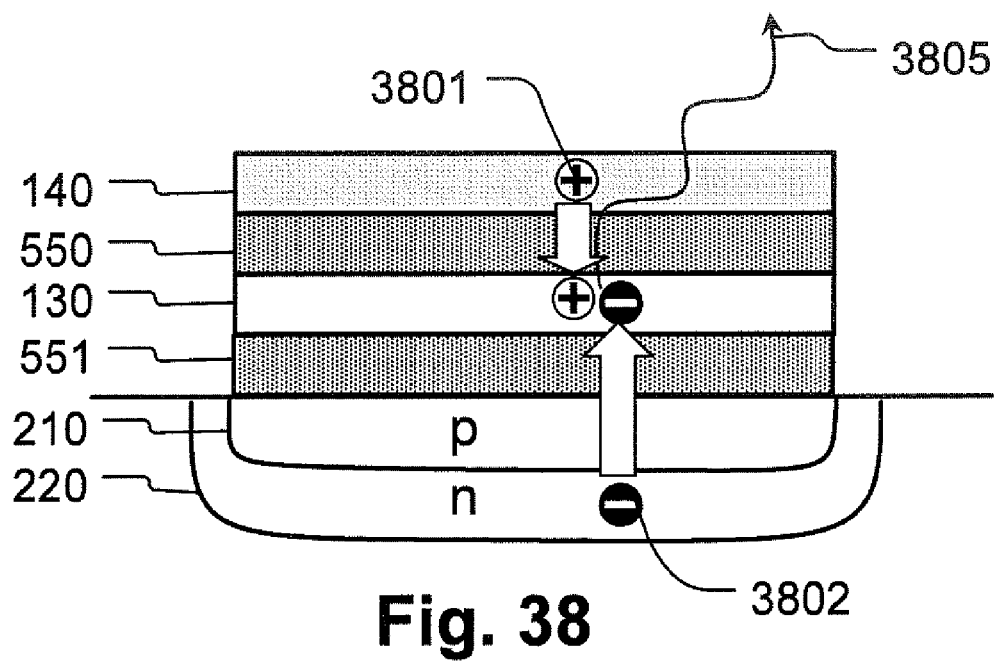
FIG. 38 shows an operating condition of an electroluminescent charge trapping device with a p-type well region in an n-type substrate region, in which relative to FIG. 39, there is an increased magnitude of forward bias between the well region and the substrate region, such that more photons are generated from the charge trapping structure.
Figure 39:
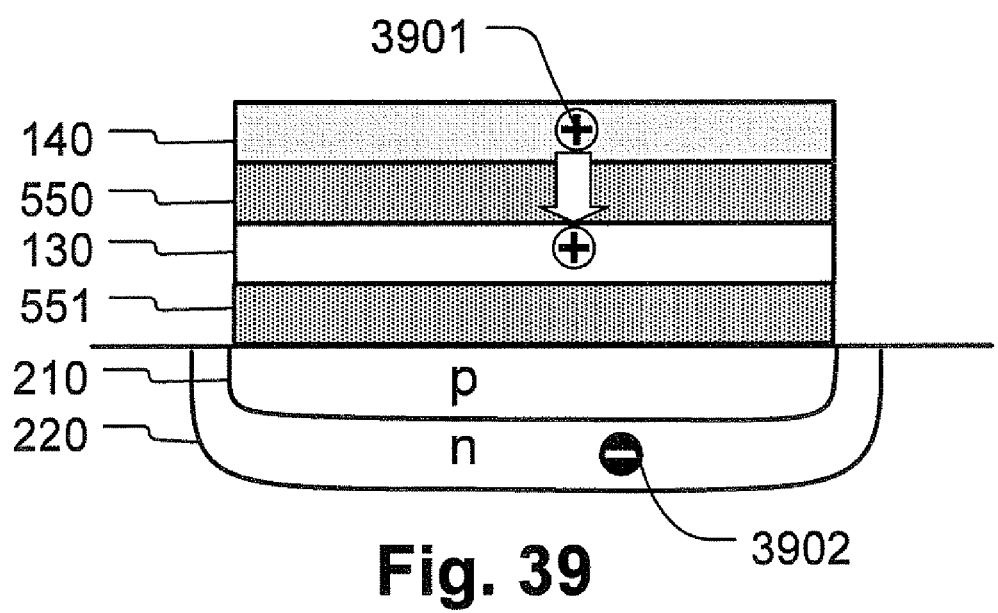
FIG. 39 shows an operating condition of an electroluminescent charge trapping device with a p-type well region in an n-type substrate region, in which relative to FIG. 38, there is a decreased magnitude of forward bias between the well region and the substrate region, such that fewer photons are generated from the charge trapping structure.

FIGS. 38 and 39 show the electroluminescent device of FIG. 27. FIG. 38 shows an operating condition of an electroluminescent charge trapping device with a p-type well region in an n-type substrate region, in which relative to FIG. 39, there is an increased magnitude of forward bias between the well region and the substrate region, such that more photons are generated from the charge trapping structure. FIG. 39 shows an operating condition of an electroluminescent charge trapping device with a p-type well region in an n-type substrate region, in which relative to FIG. 38, there is a decreased magnitude of forward bias between the well region and the substrate region, such that fewer photons are generated from the charge trapping structure. For example, applying a bias of −5 V to the n-type substrate region 220 reduces the forward bias between the n-type substrate region 220 and the p-type well region 210 such that hot electron conduction does not occur. The absence of hot electron conduction reduces the supply of electrons to the charge trapping structure 120, and reduces the combination of electrons and holes in the charge trapping structure 120 that causes photon generation.

Figure 40:
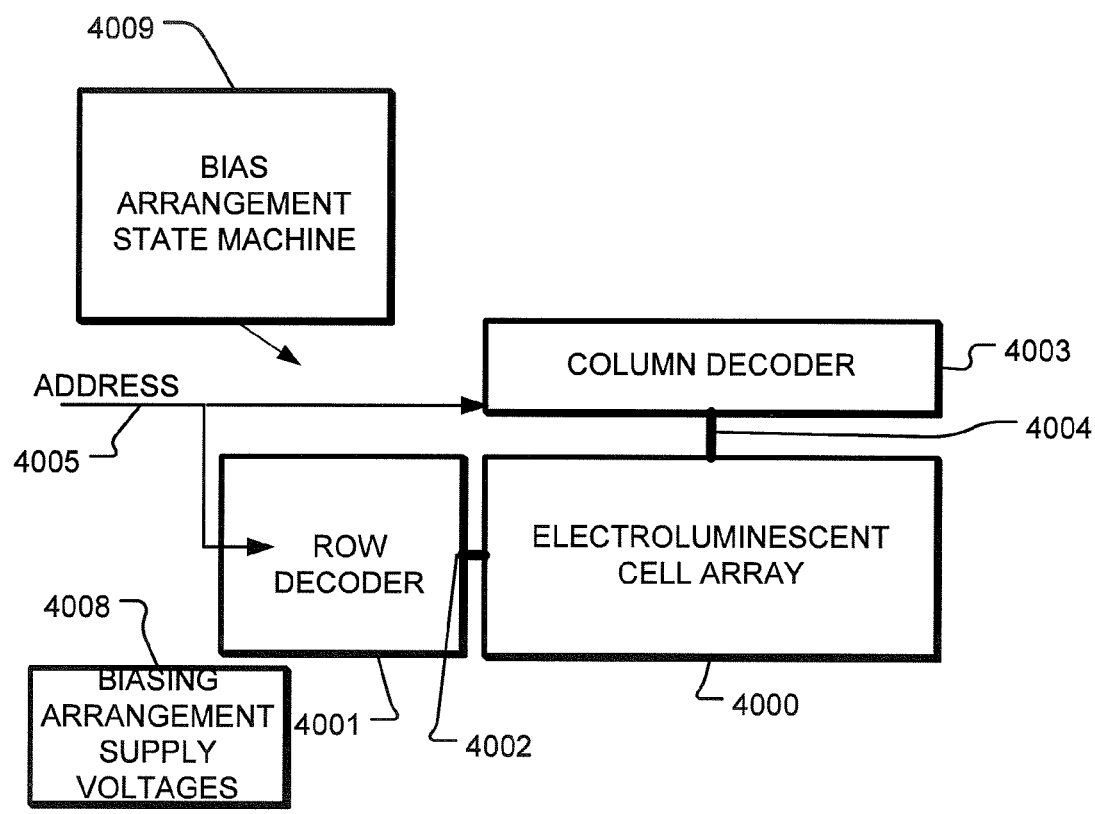
FIG. 40 shows an integrated circuit with an array of electroluminescent devices, with at least one of the forward and/or reverse bias electroluminescent devices as described.

FIG. 40 shows an integrated circuit with an array of electroluminescent devices, with at least one of the forward and/or reverse bias electroluminescent devices as described. The integrated circuit includes an electroluminescent cell array 4000 implemented with forward and/or reverse bias electroluminescent devices as described, on a semiconductor substrate. A row decoder 4001 is coupled to a plurality of word lines 4002 arranged along rows in the memory array 4000. A column decoder 4003 is coupled to a plurality of data lines 4004 arranged along columns in the memory array 4000. In an embodiment with the reverse biased electroluminescent devices, each of the data lines 4004 is coupled to the contact region of electroluminescent devices in a column associated with that data line. Addresses are supplied on bus 4070 to column decoder 4003 and row decoder 4001. A bias arrangement state machine 4009 controls the application of bias arrangement supply voltages 4008.

In an embodiment with the forward biased electroluminescent devices, a triple well can be used, to form multiple devices isolated from each other. If multiple devices are formed in the same well, they can be controlled together to emit photons at the same time.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of causing electroluminescence by combining a plurality of first charge types and a plurality of second charge types in a device including a gate providing a gate voltage, a charge trapping structure controlled by the gate voltage, a body region having a first dopant type such that the body region has the plurality of first charge types as majority carriers and the plurality of second charge types as minority carriers and including a contact region having a second dopant type such that the contact region has the plurality of second charge types as majority carriers and the plurality of first charge types as minority carriers, comprising:

reverse biasing the contact region with respect to the body region to 1) provide the plurality of first charge types from the contact region, through at least the body region, to the charge trapping structure and 2) combine the plurality of first charge types provided from the contact region and the plurality of second charge types in the charge trapping structure, thereby generating photons from the charge trapping structure.

2. The method of claim 1, wherein the body region has a first doping concentration between $10^{15}$ cm$^{-3}$ and $10^{19}$ cm$^{-3}$, and the contact region has a second doping concentration between $10^{19}$ cm$^{-3}$ and $10^{21}$ cm$^{-3}$.

3. The method of claim 1, wherein the contact region provides the plurality of first charge types to the charge trapping structure through at least the body region and one or more isolation dielectric structures.

4. The method of claim 1, wherein the body region is p-type, the contact region is n-type, the plurality of first charge types provided by the contact region are holes, and the plurality of second charge types are electrons.

5. The method of claim 1, wherein the body region is n-type, the contact region is p-type, the plurality of first charge types provided by the contact region are electrons, and the plurality of second charge types are holes.

6. The method of claim 1, wherein the body region is p-type, the contact region is n-type, the plurality of first charge types provided by the contact region are band-to-band hot holes, and the plurality of second charge types are electrons.

7. The method of claim 1, wherein the body region is n-type, the contact region is p-type, the plurality of first charge types provided by the contact region are band-to-band hot electrons, and the plurality of second charge types are holes.

8. The method of claim 1, wherein the gate provides the plurality of second charge types to the charge trapping structure.

9. The method of claim 1, wherein the gate provides the plurality of second charge types to the charge trapping structure through at least one or more isolation dielectric structures.

10. The method of claim 1, wherein the charge trapping structure provides the plurality of second charge types to the charge trapping structure.

11. The method of claim 1, wherein the charge trapping structure includes a plurality of charge trapping substructures separated from each other by one or more dielectric substructures.

12. The method of claim 1, further comprising:
controlling the charge trapping structure by performing at least one of:

generating fewer photons from the charge trapping structure by decreasing a magnitude of said reverse biasing; and generating more photons from the charge trapping structure by increasing the magnitude of said reverse biasing.

13. The method of claim 1, further comprising:

controlling the charge trapping structure by performing at least one of:

generating fewer photons from the charge trapping structure by decreasing a magnitude of an electric field moving the plurality of first charge types from the body region, to the charge trapping structure; and generating more photons from the charge trapping structure by increasing the magnitude of the electric field moving the plurality of first charge types from the body region, to the charge trapping structure.

14. A method of causing electroluminescence by combining a plurality of first charge types and a plurality of second charge types in a device including a gate providing a gate voltage, a charge trapping structure controlled by the gate voltage, a substrate region having a first dopant type such that the substrate region has the plurality of first charge types as majority carriers and the plurality of second charge types as minority carriers and including a well region having a second dopant type such that the well region has the plurality of second charge types as majority carriers and the plurality of first charge types as minority carriers, comprising:

forward biasing the substrate region with respect to the well region to 1) provide the plurality of first charge types from the substrate region, through at least the well region, to the charge trapping structure and 2) combine the plurality of first charge types provided from the contact region and the plurality of second charge types in the charge trapping structure, thereby generating photons from the charge trapping structure.

15. The method of claim 14, wherein the substrate region has a first doping concentration between $10^{10}$ cm$^{-3}$ and $10^{13}$ cm$^{-3}$, and the well region has a second doping concentration between $10^{15}$ cm$^{-3}$ and $10^{19}$ cm$^{-3}$.

16. The method of claim 14, wherein the well region provides the plurality of first charge types to the charge trapping structure through at least the well region and one or more isolation dielectric structures.

17. The method of claim 14, wherein the substrate region is p-type, the well region is n-type, the plurality of first charge types provided by the substrate region are holes, and the plurality of second charge types are electrons.

18. The method of claim 14, wherein the substrate region is n-type, the well region is p-type, the plurality of first charge types provided by the substrate region are electrons, and the plurality of second charge types are holes.

19. The method of claim 14, wherein the substrate region is p-type, the well region is n-type, the plurality of first charge types provided by the substrate region are hot holes, and the plurality of second charge types are electrons.

20. The method of claim 14, wherein the substrate region is n-type, the well region is p-type, the plurality of first charge types provided by the substrate region are hot electrons, and the plurality of second charge types are holes.

21. The method of claim 14, wherein the gate provides the plurality of second charge types to the charge trapping structure.

22. The method of claim 14, wherein the gate provides the plurality of second charge types to the charge trapping structure through at least one or more isolation dielectric structures.

23. The method of claim 14, wherein the charge trapping structure provides the plurality of second charge types to the charge trapping structure.

24. The method of claim 14, wherein the charge trapping structure includes a plurality of charge trapping substructures separated from each other by one or more dielectric substructures.

25. The method of claim 14, further comprising:

controlling the charge trapping structure by performing at least one of:

generating fewer photons from the charge trapping structure by decreasing a magnitude of said forward biasing; and generating more photons from the charge trapping structure by increasing the magnitude of said forward biasing.

26. The method of claim 14, further comprising:

controlling the charge trapping structure by performing at least one of:

generating fewer photons from the charge trapping structure by decreasing a magnitude of an electric field moving the plurality of first charge types from the substrate region, to the charge trapping structure; and generating more photons from the charge trapping structure by increasing the magnitude of the electric field moving the plurality of first charge types from the substrate region, to the charge trapping structure.

* * * * *